(12) United States Patent
Park et al.

(10) Patent No.: US 11,950,517 B2
(45) Date of Patent: Apr. 2, 2024

(54) THREE-DIMENSIONAL SEMICONDUCTOR MEMORY DEVICES

(71) Applicant: Samsung Electronics Co., Ltd., Suwon-si (KR)

(72) Inventors: Ilmok Park, Seoul (KR); Kyusul Park, Suwon-si (KR); Daehwan Kang, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 486 days.

(21) Appl. No.: 17/143,493

(22) Filed: Jan. 7, 2021

(65) Prior Publication Data

US 2021/0384427 A1 Dec. 9, 2021

(30) Foreign Application Priority Data

Jun. 9, 2020 (KR) .................. 10-2020-0069815

(51) Int. Cl.
*H10N 70/00* (2023.01)
*H10B 63/00* (2023.01)

(52) U.S. Cl.
CPC .......... *H10N 70/068* (2023.02); *H10B 63/00* (2023.02); *H10N 70/063* (2023.02); *H10N 70/066* (2023.02); *H10N 70/841* (2023.02)

(58) Field of Classification Search
None
See application file for complete search history.

(56) References Cited

U.S. PATENT DOCUMENTS

| | | | |
|---|---|---|---|
| 8,519,371 B2 | 8/2013 | Fukumizu et al. | |
| 8,536,556 B2 | 9/2013 | Fukumizu | |
| 9,012,326 B2 | 4/2015 | Kim et al. | |
| 10,084,016 B2 | 9/2018 | Donghi et al. | |
| 10,355,050 B2 | 7/2019 | Song et al. | |
| 10,566,529 B2 | 2/2020 | Jeong et al. | |
| 2009/0221146 A1 | 9/2009 | Seko et al. | |
| 2015/0028280 A1* | 1/2015 | Sciarrillo | H10B 63/20 257/4 |
| 2018/0358411 A1* | 12/2018 | Fantini | H01L 21/76224 |
| 2020/0006652 A1* | 1/2020 | Cheng | H10N 70/011 |
| 2020/0052038 A1 | 2/2020 | Kim et al. | |
| 2020/0106013 A1* | 4/2020 | Strutt | H10N 70/063 |
| 2021/0328139 A1* | 10/2021 | Lee | H10N 70/8828 |

* cited by examiner

*Primary Examiner* — Mounir S Amer
(74) *Attorney, Agent, or Firm* — HARNESS, DICKEY & PIERCE, P.L.C.

(57) ABSTRACT

A three-dimensional semiconductor memory device may include a first conductive line extending in a first direction, a second conductive line extending in a second direction crossing the first direction, a cell stack at an intersection of the first and second conductive lines, and a gapfill insulating pattern covering a side surface of the cell stack. The cell stack may include first, second, and third electrodes sequentially stacked, a switching pattern between the first and second electrodes, and a variable resistance pattern between the second and third electrodes. A top surface of the gapfill insulating pattern may be located between top and bottom surfaces of the third electrode.

20 Claims, 25 Drawing Sheets

THREE-DIMENSIONAL SEMICONDUCTOR MEMORY DEVICES

CROSS-REFERENCE TO RELATED APPLICATIONS

This U.S. non-provisional patent application claims priority under 35 U.S.C. § 119 to Korean Patent Application No. 10-2020-0069815, filed on Jun. 9, 2020, in the Korean Intellectual Property Office, the entire contents of which are hereby incorporated by reference.

BACKGROUND

The present disclosure relates to a three-dimensional semiconductor memory device, and in particular, to a three-dimensional semiconductor memory device with variable resistance memory cells.

As the demand for memory devices with large capacity and low power consumption properties increases, many studies are conducting to develop next-generation memory devices that have nonvolatile characteristics and does not need a refresh operation. The next-generation memory device may have a high integration density as in the Dynamic Random Access Memory (DRAM), a nonvolatile property as in the FLASH memory, and a high operation speed as in the Static RAM (SRAM).

In addition, to meet an increased demand for high performance and low power consumption in a semiconductor memory device, next-generation semiconductor memory devices, such as ferroelectric RAM (FRAM), magnetic RAM (MRAM), and phase-change RAM (PRAM) devices, are being developed. Each of the next generation semiconductor memory devices includes a material whose resistance varies depending on a current or voltage applied thereto and is not changed even when a supplied current or voltage is interrupted.

Furthermore, three-dimensional semiconductor memory devices including three-dimensionally arranged memory cells have been proposed to meet a continuous demand for a semiconductor device with high integration density.

SUMMARY

An embodiment of inventive concept provides a high-reliable three-dimensional semiconductor memory device including a variable resistance memory device with improved electric characteristics.

According to an embodiment of inventive concepts, a three-dimensional semiconductor memory device may include a first conductive line extending in a first direction, a second conductive line extending in a second direction crossing the first direction, a cell stack at an intersection of the first conductive line and the second conductive line, and a gapfill insulating pattern covering a side surface of the cell stack. The cell stack may include a first electrode, a second electrode, and a third electrode, which are sequentially stacked, a switching pattern between the first electrode and the second electrode, and a variable resistance pattern between the second electrode and the third electrode. A top surface of the gapfill insulating pattern may be located between a top surface of the third electrode and a bottom surface of the third electrode.

According to an embodiment of inventive concepts, a three-dimensional semiconductor memory device may include a substrate, first conductive lines on the substrate and extending in a first direction parallel to a top surface of the substrate, second conductive lines extending in a second direction crossing the first direction, cell stacks at respective intersections of the first conductive lines and the second conductive lines, a first gapfill insulating pattern filling a region between the cell stacks, and a second gapfill insulating pattern filling a region between the second conductive lines. An upper width of the first conductive lines may be smaller than a lower width of the cell stacks. A lower width of the second conductive lines may be larger than an upper width of the cell stacks. A bottom surface of the second gapfill insulating pattern may be located at a level lower than top surfaces of the cell stacks.

According to an embodiment of inventive concepts, a three-dimensional semiconductor memory device may include a substrate, first conductive lines on the substrate and extending in a first direction parallel to a top surface of the substrate, second conductive lines extending in a second direction crossing the first direction, cell stacks at respective intersections of the first conductive lines and the second conductive lines, a first gapfill insulating pattern filling a region between the cell stacks, a first capping pattern between side surfaces of the cell stacks and the first gapfill insulating pattern, a sidewall spacer, barrier metal patterns between the second conductive lines and the cell stacks, and a second gapfill insulating pattern on the first gapfill insulating pattern. Each of cell stacks may include a first electrode, a second electrode, and a third electrode sequentially stacked, a switching pattern between the first electrode and the second electrode, and a variable resistance pattern between the second electrode and the third electrode. The sidewall spacer may be between variable resistance patterns of the cell stacks and the first capping pattern. The switching pattern may have a maximum width at a level between a top surface of the switching pattern and a bottom surface of the switching pattern. The variable resistance pattern may have a minimum width at a level between a top surface of the variable resistance pattern and a bottom surface of the variable resistance pattern. A top surface of the first gapfill insulating pattern may be located between a top surface of the third electrode and a bottom surface of the third electrode. The barrier metal patterns may extend in the second direction. The second gapfill insulating pattern may cover side surfaces of the second conductive lines and side surfaces of the barrier metal patterns.

According to an embodiment of inventive concepts, a three-dimensional semiconductor memory device may include a substrate, a plurality of first conductive lines on the substrate and extending in a first direction, a plurality of second conductive lines crossing the plurality of first conductive lines and extending in a second direction crossing the first direction, first cell stacks at respective intersections of the plurality of first conductive lines and the plurality of second conductive lines, a plurality of third conductive lines crossing the plurality of second conductive lines and extending in the first direction, second cell stacks at respective intersections between the plurality of second conductive lines and the plurality of third conductive lines, first gapfill insulating patterns filling regions between the plurality of second conductive lines, and second gapfill insulating patterns filling regions between the plurality of third conductive lines. Bottom surfaces of the first gapfill insulating patterns may be located at a level lower than top surfaces of the first cell stacks. Bottom surfaces of the second gapfill insulating patterns may be located at a level lower than top surfaces of the second cell stacks.

DETAILED DESCRIPTION

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Example embodiments of inventive concepts will now be described more fully with reference to the accompanying drawings, in which example embodiments are shown.

Figure 1:
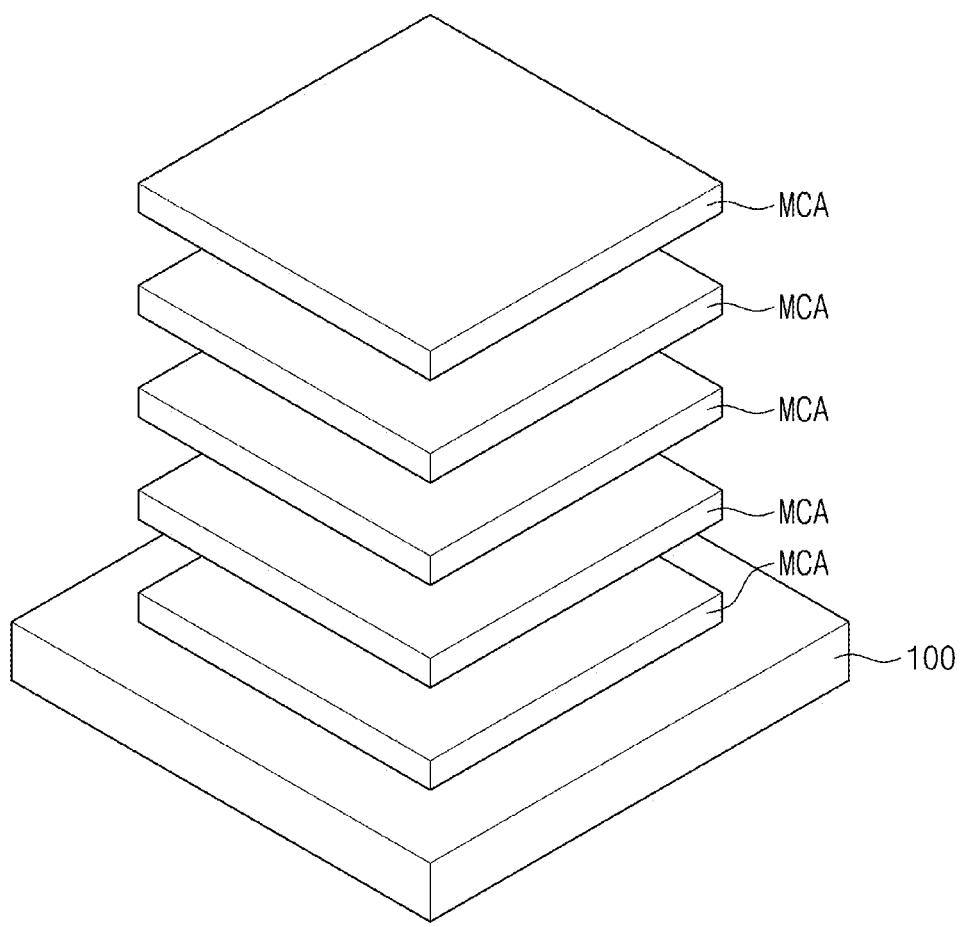
FIG. 1 is a conceptual diagram illustrating a three-dimensional semiconductor memory device according to an embodiment of inventive concepts.

FIG. 1 is a conceptual diagram illustrating a three-dimensional semiconductor memory device according to an embodiment of inventive concepts.

Referring to FIG. 1, a three-dimensional semiconductor memory device according to an embodiment of inventive concepts may include a plurality of memory cell array layers MCA, which are sequentially stacked on a substrate 100. Each of the memory cell array layers MCA may include a plurality of variable resistance memory cells, which are two-dimensionally arranged on the substrate 100. The three-dimensional semiconductor memory device may further include a plurality of conductive lines, which are disposed between the memory cell array layers MCA and are used to read, write, and erase data from or in memory cells. FIG. 1 illustrates an example, in which five memory cell array layers MCA are provided, but inventive concepts are not limited to this example.

Figure 2:
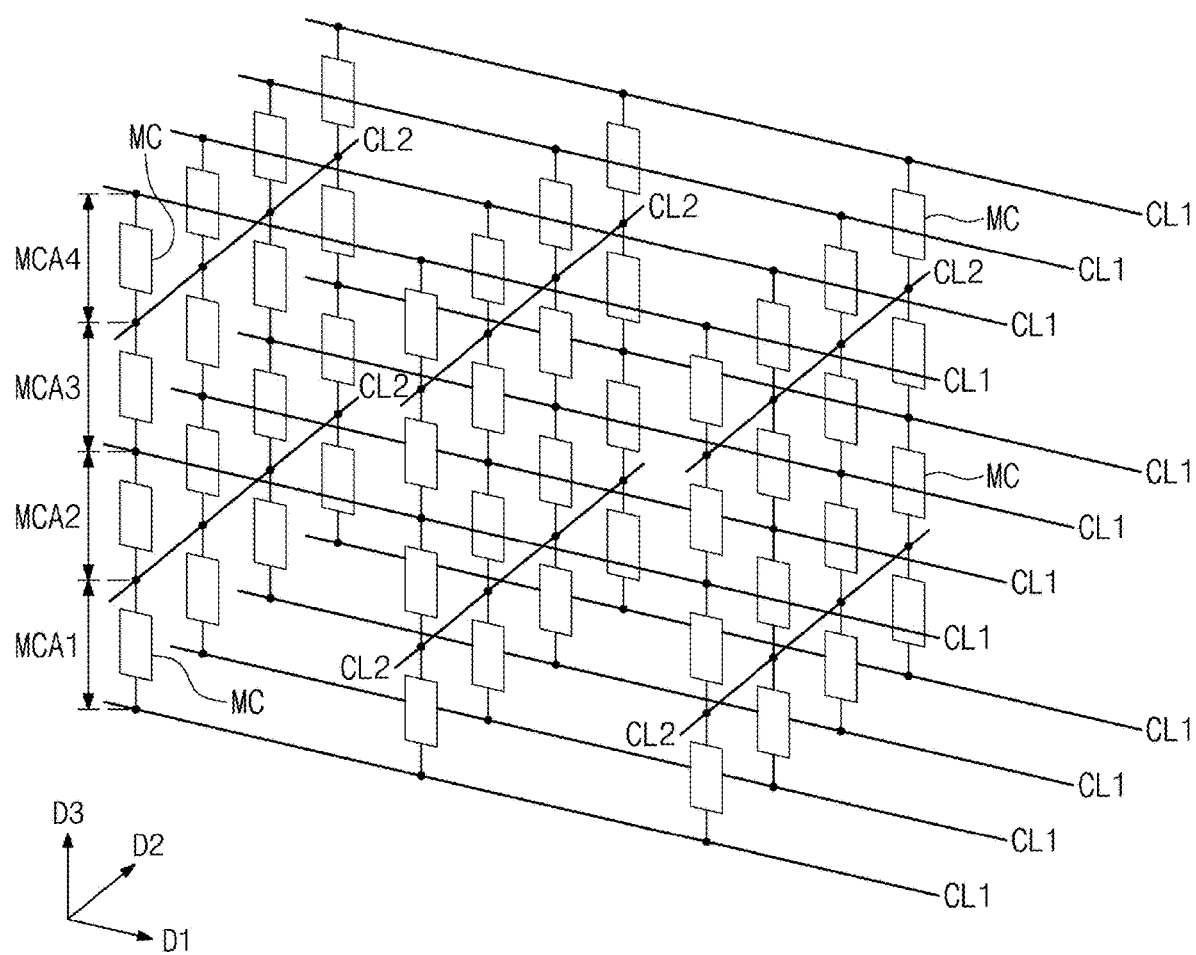
FIG. 2 is a circuit diagram illustrating a memory cell array of a three-dimensional semiconductor memory device according to an embodiment of inventive concepts.

FIG. 2 is a circuit diagram illustrating a memory cell array of a three-dimensional semiconductor memory device according to an embodiment of inventive concepts.

Referring to FIG. 2, first to fourth memory cell array layers MCA1 to MCA4 may be stacked on a plane, which are extended in two different directions (e.g., a first direction D1 and a second direction D2), in a third direction D3. Each of the first to fourth memory cell array layers MCA1 to MCA4 may include conductive lines CL1 and CL2, which are disposed to cross each other, and a plurality of memory cells MC, which are disposed at respective intersections of the conductive lines CL1 and CL2. In each of the first to fourth memory cell array layers MCA1 to MCA4, the memory cells MC may be two-dimensionally arranged in the first and second directions D1 and D2. The memory cells MC, which are adjacent to each other in the third direction D3, may share the conductive lines CL1 or CL2, which are interposed therebetween.

Figure 3:
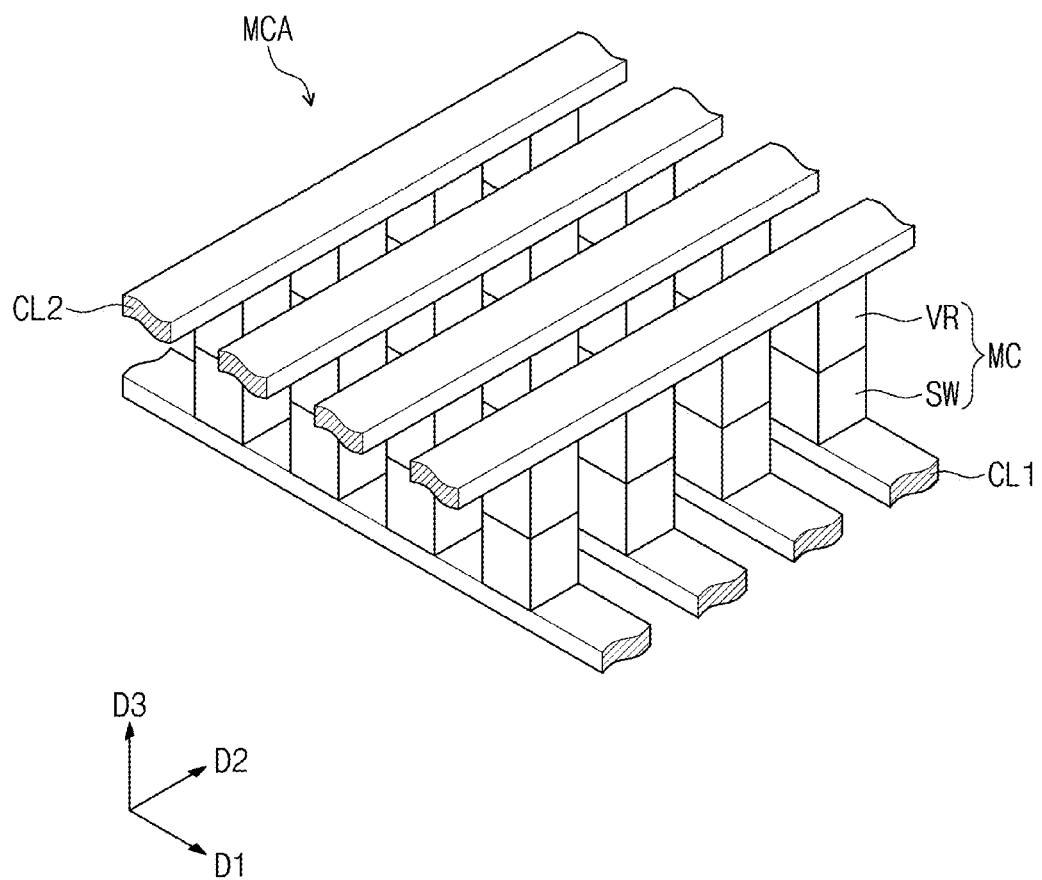
FIG. 3 is a perspective view illustrating one of cell array layers constituting a three-dimensional semiconductor memory device according to an embodiment of inventive concepts.

FIG. 3 is a perspective view illustrating one of cell array layers constituting a three-dimensional semiconductor memory device according to an embodiment of inventive concepts.

Referring to FIG. 3, a cell array layer MCA may include the first and second conductive lines CL1 and CL2, which are disposed to cross each other, and the memory cells MC.

The memory cells MC may be disposed at respective intersections of the first and second conductive lines CL1 and CL2. Each of the memory cells MC may include a switching device SW and a variable resistor VR. The memory cells MC may be configured to be spaced apart from each other in both of the first and second directions D1 and D2.

The variable resistors VR may be respectively disposed at the intersections of the first and second conductive lines CL1 and CL2, and the switching devices SW may be respectively disposed between the variable resistors VR and the first conductive lines CL1.

In the present embodiment, the switching device SW is illustrated to be placed between the variable resistor VR and the first conductive line CL1, but in other embodiments, the switching device SW may be disposed between the variable resistor VR and the second conductive line CL2.

Figure 4:
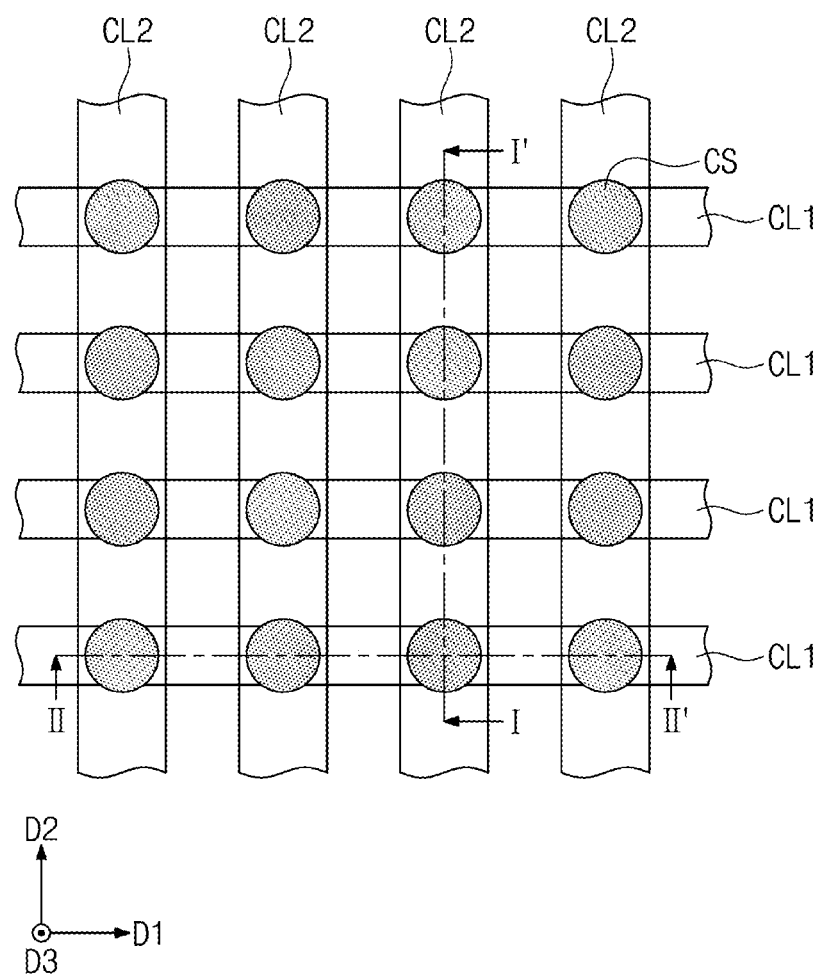
FIG. 4 is a plan view illustrating a three-dimensional semiconductor memory device according to an embodiment of inventive concepts.
Figure 5:
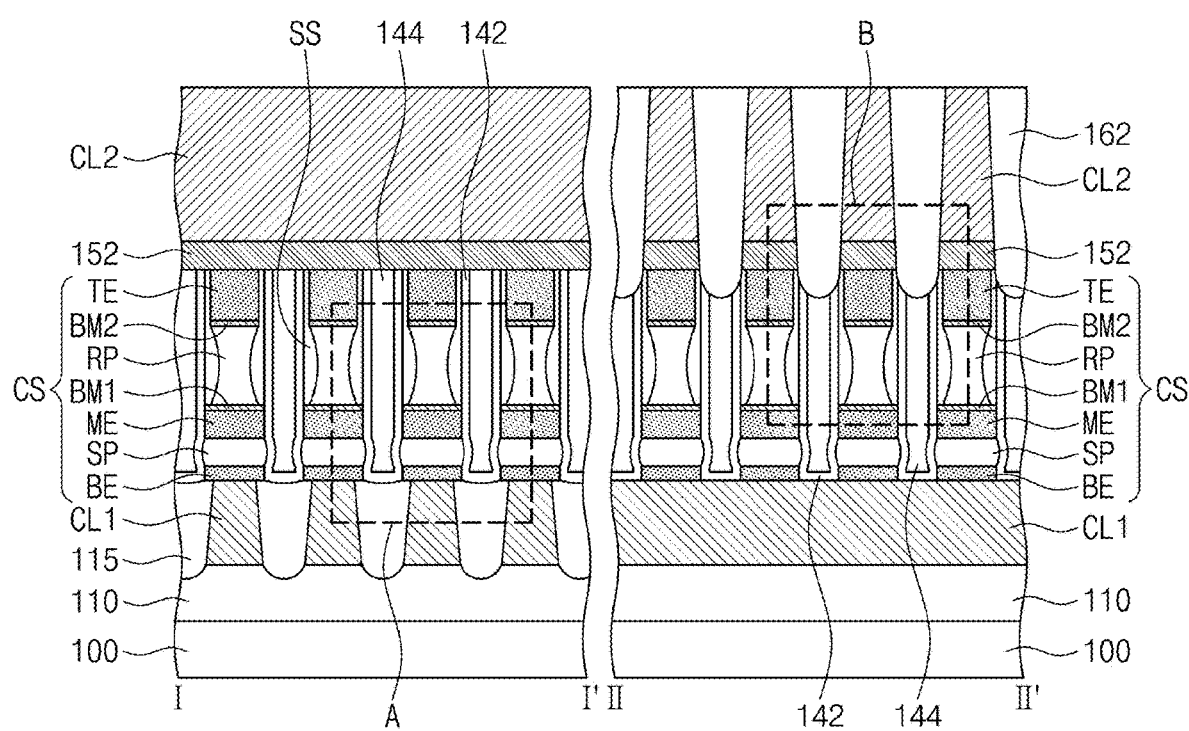
FIG. 5 is a sectional view illustrating two portions (e.g., taken along lines I-I' and II-II' of FIG. 4) of a three-dimensional semiconductor memory device according to an embodiment of inventive concepts.
Figure 6A:
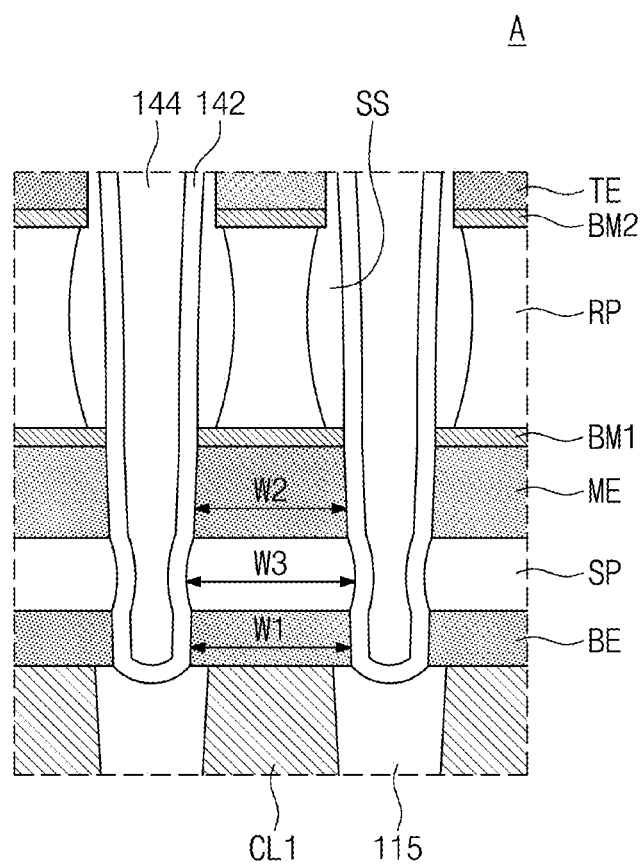
FIG. 6A is a sectional view illustrating an enlarged structure of a portion A of FIG. 5.
Figure 6B:
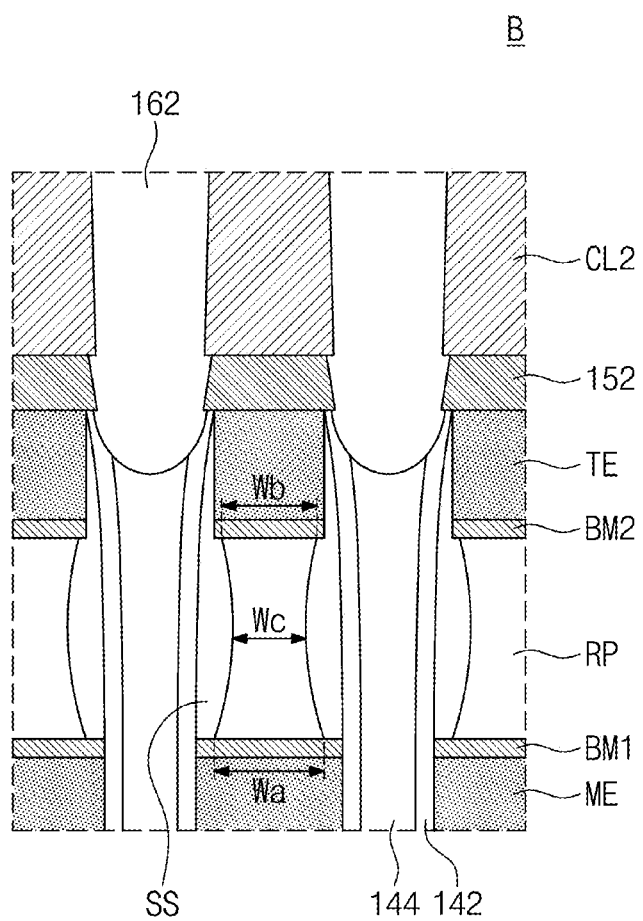
FIGS. 6B, 6C, and 6D are sectional views, each of which illustrates an enlarged structure of a portion B of FIG. 5.
Figure 6C:
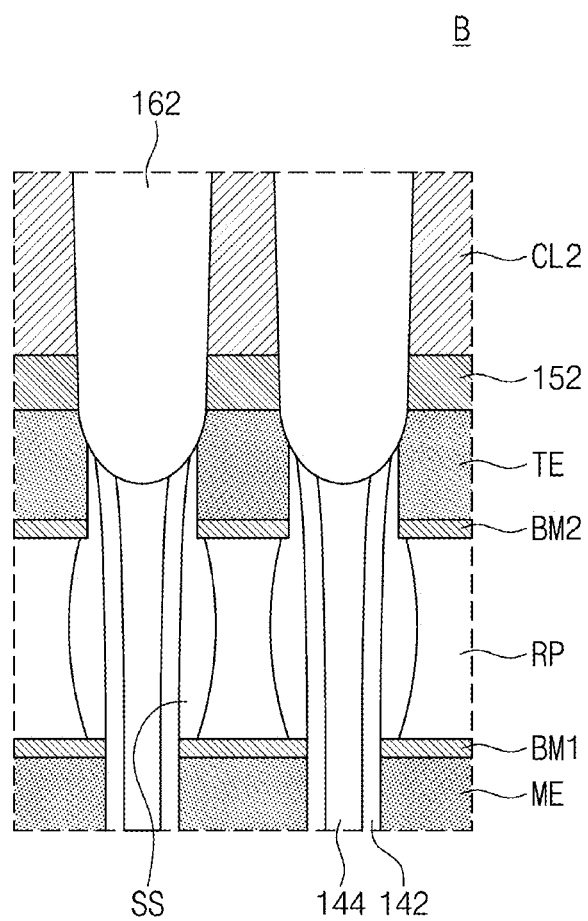
Figure 6D:
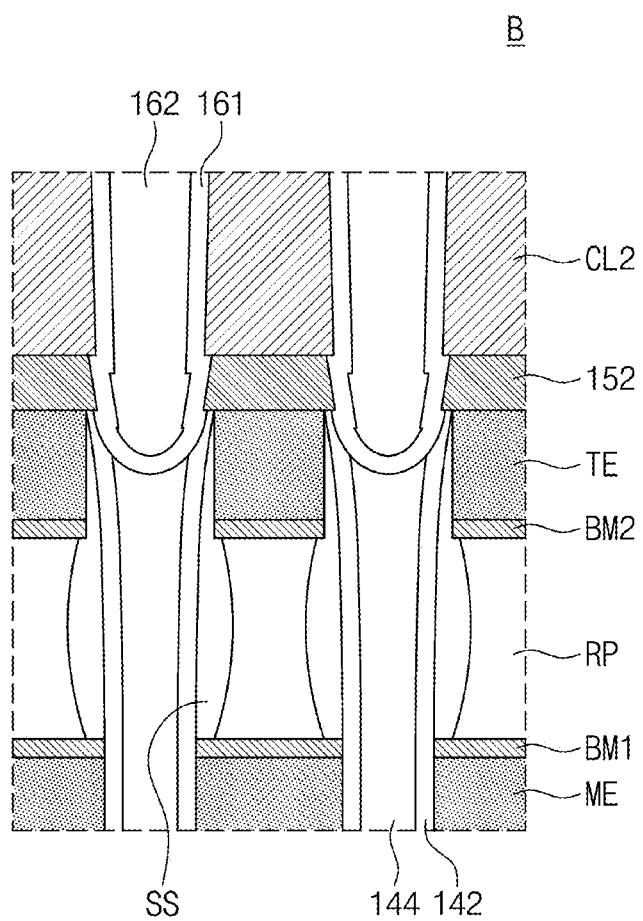

FIG. 4 is a plan view illustrating a three-dimensional semiconductor memory device according to an embodiment of inventive concepts. FIG. 5 is a sectional view illustrating two portions (e.g., taken along lines I-I' and II-II' of FIG. 4) of a three-dimensional semiconductor memory device according to an embodiment of inventive concepts. FIG. 6A is a sectional view illustrating an enlarged structure of a portion A of FIG. 5. FIGS. 6B, 6C, and 6D are sectional views, each of which illustrates an enlarged structure of a portion B of FIG. 5.

Referring to FIGS. 4 and 5, the first conductive lines CL1, which are extended in the first direction D1 and are spaced apart from each other in the second direction D2, may be disposed on the substrate 100. The first and second directions D1 and D2 may be parallel to a top surface of the substrate 100 and may not be parallel to each other.

The first conductive lines CL1 may have an upper width, which is smaller than its lower width, and may have an inclined side surface. The first conductive lines CL1 may be formed of or include at least one of metallic materials (e.g., copper, tungsten, or aluminum) and/or metal nitrides (e.g., tantalum nitride, titanium nitride, or tungsten nitride).

An interlayer insulating layer 110 may be provided between the first conductive lines CL1 and the substrate 100. The interlayer insulating layer 110 may be formed of or include at least one of silicon oxide, silicon nitride, or silicon oxynitride.

Lower insulating patterns 115 may be disposed between the first conductive lines CL1. The lower insulating patterns 115 may be extended parallel to the first conductive lines CL1 or in the first direction D1. The lower insulating patterns 115 may have top surfaces that are located at substantially the same level as or a lower level than top surfaces of the first conductive lines CL1. The lower insulating patterns 115 may include lower portions, which are disposed in the interlayer insulating layer 110. For example, bottom surfaces of the lower insulating patterns 115 may be located at a level that is lower than bottom surfaces of the first conductive lines CL1. The lower insulating patterns 115 may be formed of or include at least one of, for example, silicon oxide, silicon nitride, or silicon oxynitride.

The second conductive lines CL2 may be provided to cross the first conductive lines CL1. The second conductive lines CL2 may be extended in the second direction D2 and may be spaced apart from each other in the first direction D1. The second conductive lines CL2 may be spaced apart from the first conductive lines CL1 in the third direction D3 perpendicular to the top surface of the substrate 100. The second conductive lines CL2 may be formed of or include at least one of metallic materials (e.g., copper, tungsten, or aluminum) or metal nitrides (e.g., tantalum nitride, titanium nitride, or tungsten nitride).

Cell stacks CS may be disposed at the intersections of the first and second conductive lines CL1 and CL2. For example, the cell stacks CS on each of the first conductive lines CL1 may be spaced apart from each other in the first direction D1. Each of the cell stacks CS may be a pillar-shaped structure with a circular top surface. In an embodiment, each of the cell stacks CS may have an upper width, which is smaller than its lower width, but in other embodiments, the lower and upper widths of each cell stack CS may be substantially equal to each other.

Each of the cell stacks CS may include a switching pattern SP, which is provided between the first conductive line CL1 and the second conductive line CL2, and a variable resistance pattern RP, which is provided between the switching pattern SP and the second conductive line CL2.

As an example, each of the cell stacks CS may include a first electrode BE, the switching pattern SP, a second electrode ME, the variable resistance pattern RP, and a third electrode TE, which are sequentially stacked. Furthermore, each of the cell stacks CS may further include a first metal pattern BM1 between the second electrode ME and the variable resistance pattern RP and a second metal pattern BM2 between the third electrode TE and the variable resistance pattern RP.

The following description will refer to an example, in which the switching pattern SP is disposed between the first electrode BE and the second electrode ME and the variable resistance pattern RP is disposed between the second electrode ME and the third electrode TE, but inventive concepts are not limited to this example. For example, in an embodiment, the variable resistance pattern RP may be disposed between the first electrode BE and the second electrode ME, and the switching pattern SP may be disposed between the second electrode ME and the third electrode TE.

In an embodiment, each of the switching patterns SP of the cell stacks CS may be an ovonic threshold switch (OTS) device having a bi-directional property. As an example, the switching patterns SP may be elements exhibiting nonlinear I-V characteristics (e.g., an 'S'-shaped I-V curve), based on a threshold switching phenomenon. The switching patterns SP may have a high phase transition temperature from crystalline to amorphous or vice versa, compared with the variable resistance patterns RP. In an embodiment, the phase transition temperature of the switching patterns SP may range from about 350° C. to about 450° C. Accordingly, during a typical operation of the three-dimensional semiconductor memory device under an operation voltage, the variable resistance patterns RP may be reversibly changed from the crystalline structure to the amorphous structure or vice versa, whereas the switching patterns SP may be maintained to the substantially amorphous structure without any change in its crystal structure. In the present specification, the substantially amorphous structure does not exclude a crystalline structure of an object, in which crystalline grains locally exist or a locally crystallized portion exists.

The switching patterns SP may be formed of a compound containing at least one of chalcogenide elements (e.g., Te, Se, and S) and at least one of, for example, Ge, Sb, Bi, Al, Pb, Sn, Ag, As, S, Si, In, Ti, Ga, or P. The switching patterns SP may further contain a thermal stabilization element, in addition to the compound. The thermal stabilization element may be at least one of B, C, N, or O. The switching patterns SP may be provided in a single-layered structure or in a multi-layered structure including a plurality of stacked layers.

In an embodiment, the switching patterns SP may be formed of or include at least one of GeSe, GeS, AsSe, AsTe, AsS SiTe, SiSe, SiS, GeAs, SiAs, SnSe, or SnTe. In an embodiment, the switching patterns SP may be formed of or include at least one of GeAsTe, GeAsSe, AlAsTe, AlAsSe, SiAsSe, SiAsTe, GeSeTe, GeSeSb, GaAsSe, GaAsTe, InAsSe, InAsTe, SnAsSe, or SnAsTe. In an embodiment, the switching patterns SP may be formed of or include at least one of GeSiAsTe, GeSiAsSe, GeSiSeTe, GeSeTeSb, GeSiSeSb, GeSiTeSb, GeSeTeBi, GeSiSeBi, GeSiTeBi, GeAsSeSb, GeAsTeSb, GeAsTeBi, GeAsSeBi, GeAsSeIn, GeAsSeGa, GeAsSeAl, GeAsSeTl, GeAsSeSn, GeAsSeZn, GeAsTeIn, GeAsTeGa, GeAsTeAl, GeAsTeTl, GeAsTeSn, or GeAsTeZn.

In an embodiment, the switching patterns SP may be formed of or include at least one of GeSiAsSeTe, GeAsSeTeS, GeSiAsSeS, GeSiAsTeS, GeSiSeTeS, GeSiAsSeP, GeSiAsTeP, GeAsSeTeP, GeSiAsSeIn, GeSiAsSeGa, GeSiAsSeAl, GeSiAsSeTl, GeSiAsSeZn, GeSiAsSeSn, GeSiAsTeIn, GeSiAsTeGa, GeSiAsTeAl, GeSiAsTeTl, GeSiAsTeZn, GeSiAsTeSn, GeAsSeTeIn, GeAsSeTeGa, GeAsSeTeAl, GeAsSeTeTl, GeAsSeTeZn, GeAsSeTeSn, GeAsSeSIn, GeAsSeSGa, GeAsSeSAl, GeAsSeSTl, GeAsSeSZn, GeAsSeSSn, GeAsTeSIn, GeAsTeSGa, GeAsTeSAl, GeAsTeSTl, GeAsTeSZn, GeAsTeSSn, GeAsSeInGa, GeAsSeInAl, GeAsSeInTl, GeAsSeInZn, GeAsSeInSn, GeAsSeGaAl, GeAsSeGaTl, GeAsSeGaZn, GeAsSeGaSn, GeAsSeAlTl, GeAsSeAlZn, GeAsSEAlSn, GeAsSeTlZn, GeAsSeTlSn, or GeAsSeZnSn.

In an embodiment, the switching patterns SP may be formed of or include at least one of GeSiAsSeTeS, GeSiAsSeTeIn, GeSiAsSeTeGa, GeSiAsSeTeAl, GeSiAsSeTeTl, GeSiAsSeTeZn, GeSiAsSeTeSn, GeSiAsSeTeP, GeSiAsSeIn, GeSiAsSeGa, GeSiAsSeSAl, GeSiAsSeSTl, GeSiAsSeSZn, GeSiAsSeSSn, GeAsSeTeSIn, GeAsSeTeSGa, GeAsSeTeSAl, GeAsSeTeSTl, GeAsSeTeSZn, GeAsSeTeSSn, GeAsSeTePIn, GeAsSeTePGa, GeAsSeTePAl, GeAsSeTePTl, GeAsSeTePZn, GeAsSeTePSn, GeSiAsSeInGa, GeSiAsSeInAl, GeSiAsSeInTl, GeSiAsSeInZn, GeSiAsSeInSn, GeSiAsSeGaAl, GeSiAsSeGaTl, GeSiAsSeGaZn, GeSiAsSeGaSn, GeSiAsSeAlSn, GeAsSeTeInGa, GeAsSeTeInAl, GeAsSeTeInTl, GeAsSeTeInZn, GeAsSeTeInSn, GeAsSeTeGaAl, GeAsSeTeGaTl, GeAsSeTeGaZn, GeAsSeTeGaSn, GeAsSeTeAlSn, GeAsSeSInGa, GeAsSeSInAl, GeAsSeSInTl, GeAsSeSInZn, GeAsSeSInSn, GeAsSeSGaAl, GeAsSeSGaTl, GeAsSeSGaZn, GeAsSeSGaSn, or GeAsSeSAlSn.

In an embodiment, each of the switching patterns SP may have a rounded side surface, as shown in FIG. 6A. The switching pattern SP may have a laterally-convex side surface, compared with side surfaces of the first and second electrodes BE and ME. The switching pattern SP may have a first lower width W1 at its bottom level and a first upper width W2, which is smaller than the first lower width W1, at its top level. The switching pattern SP may have the maximum width W3 at its intermediate level (e.g., between the bottom and top levels).

A distance between adjacent ones of the switching patterns SP may be smaller than a distance between adjacent ones of the first electrodes BE or than a distance between adjacent ones of the second electrodes ME.

The variable resistance patterns RP of the cell stacks CS may be formed of or include at least one of materials with a data-storing property. In the case where the three-dimensional semiconductor memory device is a phase change memory device, the variable resistance patterns RP may be formed of or include a phase-changeable material, whose crystalline structure can be reversibly switched to one of crystalline and amorphous structures depending on its temperature. As an example, a phase transition temperature (e.g., from crystalline to amorphous or vice versa) of the variable resistance patterns RP may range from about 250° C. to about 350° C.

The variable resistance patterns RP may be formed of a compound containing at least one of chalcogenide elements (e.g., Te, Se, and S) and at least one of, for example, Ge, Sb, Bi, Pb, Sn, Ag, As, S, Si, In, Ti, Ga, P, O, or C.

In an embodiment, the variable resistance patterns RP may be formed of or include at least one of GeTe, GeSe, GeS, SbSe, SbTe, SbS, SbSe, SnSb, InSe, InSb, AsTe, AlTe, GaSb, AlSb, BiSb, ScSb, Ysb, CeSb, DySb, or NdSb. In an embodiment, the variable resistance patterns RP may be formed of or include at least one of GeSbSe, AlSbTe, AlSbSe, SiSbSe, SiSbTe, GeSeTe, InGeTe, GeSbTe, GeAsTe, SnSeTe, GeGaSe, BiSbSe, GaSeTe, InGeSb, GaSbSe, GaSbTe, InSbSe, InSbTe, SnSbSe, SnSbTe, ScSbTe, ScSbSe, ScSbS, YSbTe, YSbSe, YSbS, CeSbTe, CeSbSe, CeSbS, DySbTe, DySbSe, DySbS, NdSbTe, NdSbSe, or NdSbS. In an embodiment, the variable resistance patterns RP may be formed of or include at least one of GeSbTeS, BiSbTeSe, AgInSbTe, GeSbSeTe, GeSnSbTe, SiGeSbTe, SiGeSbSe, SiGeSeTe, BiGeSeTe, BiSiGeSe, BiSiGeTe, GeSbTeBi, GeSbSeBi, GeSbSeIn, GeSbSeGa, GeSbSeAl, GeSbSeTl, GeSbSeSn, GeSbSeZn, GeSbTeIn, GeSbTeGa, GeSbTeAl, GeSbTeTl, GeSbTeSn, GeSbTeZn, ScGeSbTe, ScGeSbSe, ScGeSbS, YGeSbTe, YGeSbSe, YGeSbS, CeGeSbTe, CeGeSbSe, CeGeSbS, DyGeSbTe, DyGeSbSe, DyGeSbS, NdGeSbTe, NdGeSbSe, or NdGeSbS.

In an embodiment, the variable resistance patterns RP may be formed of or include at least one of InSbTeAsSe, GeScSbSeTe, GeSbSeTeS, GeScSbSeS, GeScSbTeS, GeScSeTeS, GeScSbSeP, GeScSbTeP, GeSbSeTeP, GeScSbSeIn, GeScSbSeGa, GeScSbSeAl, GeScSbSeTl, GeScSbSeZn, GeScSbSeSn, GeScSbTeIn, GeScSbTeGa, GeSbAsTeAl, GeScSbTeTl, GeScSbTeZn, GeScSbTeSn, GeSbSeTeIn, GeSbSeTeGa, GeSbSeTeAl, GeSbSeTeTl, GeSbSeTeZn, GeSbSeTeSn, GeSbSeSIn, GeSbSeSGa, GeSbSeSAl, GeSbSeSTl, GeSbSeSZn, GeSbSeSSn, GeSbTeSIn, GeSbTeSGa, GeSbTeSAl, GeSbTeSTl, GeSbTeSZn, GeSbTeSSn, GeSbSeInGa, GeSbSeInAl, GeSbSeInTl, GeSbSeInZn, GeSbSeInSn, GeSbSeGaAl, GeSbSeGaTl, GeSbSeGaZn, GeSbSeGaSn, GeSbSeAlTl, GeSbSeAlZn, GeSbSeAlSn, GeSbSeTlZn, GeSbSeTlSn, or GeSbSeZnSn.

In an embodiment, the variable resistance patterns RP may have a single-layered structure or a multi-layered structure including a plurality of stacked layers. In an embodiment, the variable resistance patterns RP may have a super lattice structure, in which a germanium-containing layer and a germanium-free layer are repeatedly stacked. As an example, the variable resistance patterns RP may have a structure, in which GeTe and SbTe layers are repeatedly stacked.

In an embodiment, the variable resistance patterns RP may be formed of or include at least one of perovskite compounds or conductive metal oxides. For example, the variable resistance patterns RP may be formed of or include at least one of niobium oxide, titanium oxide, nickel oxide, zirconium oxide, vanadium oxide, $(Pr,Ca)MnO_3$ (PCMO), strontium-titanium oxide, barium-strontium-titanium oxide, strontium-zirconium oxide, barium-zirconium oxide, or barium-strontium-zirconium oxide. In the case where the variable resistance patterns RP include transition metal oxides, the variable resistance patterns RP may have a higher dielectric constant than that of silicon oxide.

In an embodiment, the variable resistance patterns RP may have a double-layered structure including a conductive metal oxide layer and a tunnel insulating layer or may have a triple-layered structure including a first conductive metal oxide layer, a tunnel insulating layer, and a second conductive metal oxide layer. In this case, the tunnel insulating layer may be formed of or include at least one of aluminum oxide, hafnium oxide, or silicon oxide.

In an embodiment, the variable resistance patterns RP may have a thickness that is larger than a thickness of the switching pattern SP.

Each of the variable resistance patterns RP may have a rounded side surface, as shown in FIG. 6B. In detail, the variable resistance pattern RP may have a recessed side surface, compared with the side surfaces of the second and third electrodes ME and TE. The variable resistance pattern RP may have a second lower width Wa at its bottom level and may have a second upper width Wb, which is larger than the second lower width Wa, at its top level. The variable resistance pattern RP may have the minimum width Wc at its intermediate level (e.g., the top and bottom levels). Since a center portion of the variable resistance pattern RP has the minimum width, an electric resistance of the variable resistance pattern RP may be increased at its center portion. Thus, it may be possible to more easily produce heat for an operation of a three-dimensional semiconductor memory device.

A sidewall spacer SS may be provided on the first metal pattern BM1 to cover a side surface of the variable resistance pattern RP. The sidewall spacer SS may be aligned to a side surface of the first metal pattern BM1. The sidewall spacer SS may include a single layer or a plurality of layers. The sidewall spacer SS may be formed of or include at least one of silicon oxide, silicon nitride, and/or silicon oxynitride.

The first and second metal patterns BM1 and BM2 may respectively cover top and bottom surfaces of the variable resistance patterns RP. In an embodiment, a width of the second metal pattern BM2 may be smaller than a width of the first metal pattern BM1. The first and second metal patterns BM1 and BM2 may prevent a material constituting the variable resistance patterns RP from being diffused. In addition, the first metal patterns BM1 may be provided between the variable resistance patterns RP and the switching patterns SP to improve a contact resistance property therebetween. The first and second metal patterns BM1 and BM2 may be formed of or include at least one of W, Ti, Al, Cu, C, CN, TiN, TiAlN, TiSiN, TiCN, WN, CoSiN, WSiN, TaN, TaCN, or TaSiN.

Each of the first, second, and third electrodes BE, ME, and TE may be formed of or include at least one of conductive materials. As an example, the first, second, and third electrodes BE, ME, and TE may be carbon electrodes that are formed of or include carbon. The first, second, and third electrodes BE, ME, and TE may be formed of or include metals and/or metal nitrides. A lower width of the first electrode BE may be larger than or substantially equal to an upper width of the first conductive line CL1 thereunder, as shown in FIG. 6A. The third electrode TE may be thicker than the first and second electrodes BE and ME, as shown in FIG. 5.

A first gapfill insulating pattern 144 may be provided to fill a region between the cell stacks CS. The first gapfill insulating pattern 144 may be extended in the first and second directions D1 and D2 to electrically separate the cell stacks CS from each other in the first and second directions D1 and D2. The first gapfill insulating pattern 144 may be formed of or include at least one of low-k dielectric materials. For example, the first gapfill insulating pattern 144 may be formed of or include at least one of SiN, SiON, SiC, SiCN, SiOC, SiOCN, SiO$_2$, or Al$_2$O$_3$.

Between adjacent ones of the cell stacks CS in the first direction D1, a top surface of the first gapfill insulating pattern 144 may be located at a level lower than the top surfaces of the cell stacks CS. In detail, the top surface of the first gapfill insulating pattern 144 may be located between top and bottom surfaces of the third electrode TE of each cell stack CS. In addition, the first gapfill insulating pattern 144 may have a rounded top surface, between adjacent ones of the cell stacks CS in the first direction D1.

A first capping pattern 142 may be disposed between the first gapfill insulating pattern 144 and side surfaces of the cell stacks CS. The first capping pattern 142 may be in direct contact with the side surfaces of the switching patterns SP and the sidewall spacer SS. A bottom portion of the first capping pattern 142 may be disposed between a bottom surface of the first gapfill insulating pattern 144 and the top surfaces of the lower insulating patterns 115 and between the bottom surface of the first gapfill insulating pattern 144 and the top surfaces of the first conductive lines CL1. The first capping pattern 142 may be provided to cover the side surfaces of the cell stacks CS and the bottom surface of the first gapfill insulating pattern 144 with a substantially uniform thickness. The first capping pattern 142 may be formed of or include an insulating material different from the first gapfill insulating pattern 144. The first capping pattern 142 may be formed of or include at least one of, for example, SiN, SiO$_2$, SiON, SiBN, SiCN, SIOCN, Al$_2$O$_3$, AlN, or AlON.

The second conductive lines CL2 may be provided on the cell stacks CS to extend in the second direction D2. The second conductive lines CL2 may be formed of or include the same metal material as the first conductive lines CL1. The second conductive lines CL2 may have a thickness that is larger than that of the first conductive lines CL1. The second conductive lines CL2 may be at least two times thicker than the first conductive lines CL1. An upper width of the second conductive line CL2 may be smaller than its lower width and may have an inclined side surface. The second conductive lines CL2 may be formed of or include at least one of, for example, metals (e.g., copper, tungsten, or aluminum) and/or metal nitrides (e.g., tantalum nitride, titanium nitride, or tungsten nitride).

A barrier metal pattern 152 may be disposed between the cell stacks CS, which are arranged in the second direction D2, and each of the second conductive lines CL2. The barrier metal pattern 152 may be extended parallel to the second conductive line CL2 or in the second direction D2. The barrier metal pattern 152 may be formed of or include at least one of conductive materials having an etch selectivity with respect to the second conductive lines CL2.

The barrier metal pattern 152 may be formed of or include at least one of metals and/or metal nitrides. The barrier metal pattern 152 may be formed of or include at least one of, for example, Ti, Ta, TiN, TaN, or AlN. The barrier metal pattern 152 may have a thickness ranging from about 30 Å to about 150 Å.

Referring to FIG. 6B, the barrier metal pattern 152 may have an upper width, which is smaller than its lower width, and may have an inclined side surface. The lower width of the barrier metal pattern 152 may be larger than the upper width of the third electrode TE of the cell stack CS. The upper width of the barrier metal pattern 152 may be smaller than the lower width of the second conductive line CL2.

A top surface of the barrier metal pattern 152 may be in contact with a bottom surface of the second conductive line CL2, and a bottom surface of the barrier metal pattern 152 may be in contact with top surfaces of the third electrodes TE of the cell stacks CS. The bottom surface of the barrier metal pattern 152 may be in contact with the entire top surface of the third electrode TE of each cell stack CS, as shown in FIG. 6B.

Second gapfill insulating patterns or separation insulating patterns 162 may be provided to fill regions between the second conductive lines CL2 and between the barrier metal patterns 152. The second gapfill insulating patterns 162 may be extended parallel to the second conductive lines CL2 or in the second direction D2. The second gapfill insulating patterns 162 may be in contact with the first capping pattern 142 and the first gapfill insulating pattern 144. As shown in FIG. 6C, each of the second gapfill insulating patterns 162 may be in contact with a portion of the third electrode TE of the cell stack CS.

Bottom surfaces of the second gapfill insulating patterns 162 may be located at a level lower than the bottom surface of the barrier metal pattern 152. The bottom surfaces of the second gapfill insulating patterns 162 may be located between the top and bottom surfaces of the third electrode TE of the cell stack CS. The second gapfill insulating patterns 162 may have a rounded bottom surface, and the lowermost point of the second gapfill insulating patterns 162 may be located between the top and bottom surfaces of the third electrode TE of the cell stack CS. The second gapfill insulating patterns 162 may be formed of or include at least one of low-k dielectric materials. As an example, the second gapfill insulating patterns 162 may be formed of or include at least one of SiN, SiON, SiC, SiCN, SiOC, SiOCN, SiO$_2$, or Al$_2$O$_3$.

Referring to FIG. 6D, a second capping pattern 161 may be disposed between the side surface of the second conductive line CL2 and the second gapfill insulating pattern 162 and between the side surface of the barrier metal pattern 152 and the second gapfill insulating pattern 162. The second capping pattern 161 may be provided to have a uniform thickness and may be continuously extended from the side surface of the second conductive line CL2 to the side surface of the barrier metal pattern 152. A portion of the second capping pattern 161 may be disposed between the bottom surface of the second gapfill insulating pattern 162 and the top surface of the first gapfill insulating pattern 144. The second capping pattern 161 may be formed of or include an insulating material different from the first and second gapfill insulating patterns 144 and 162. The second capping pattern 161 may be formed of or include at least one of, for example, SiN, $SiO_2$, SiON, SiBN, SiCN, SIOCN, $Al_2O_3$, AlN, or AlON.

FIGS. 7 to 12 are sectional views, each of which illustrates two portions (e.g., taken along the lines I-I' and II-II' of FIG. 4) of a three-dimensional semiconductor memory device according to an embodiment of inventive concepts. In the following description, an element described above may be identified by the same reference number without repeating an overlapping description thereof, for the sake of brevity.

Figure 7:
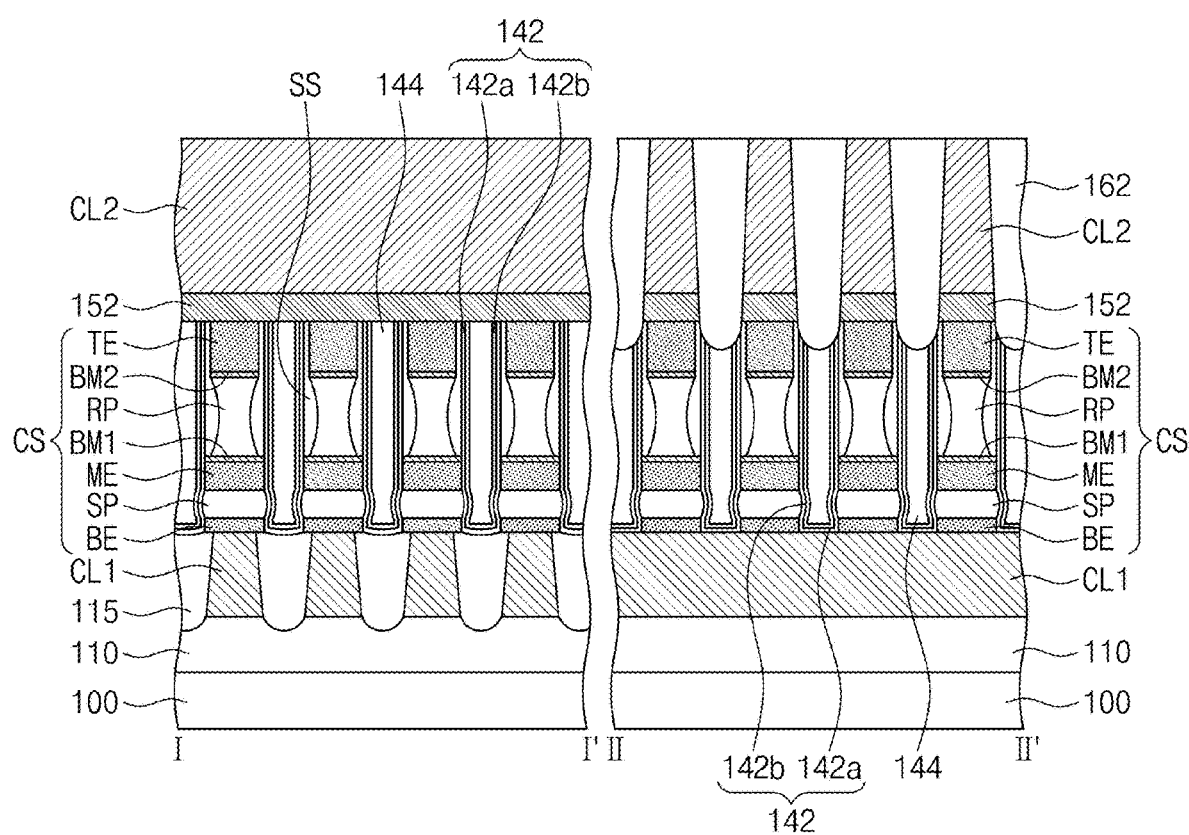
FIGS. 7 to 12 are sectional views, each of which illustrates two portions (e.g., taken along the lines I-I' and II-II' of FIG. 4) of a three-dimensional semiconductor memory device according to an embodiment of inventive concepts.

Referring to FIG. 7, the first capping pattern 142 may include a first capping layer 142a and a second capping layer 142b. The first and second capping layers 142a and 142b may be formed of or include materials different from each other. In an embodiment, the material for each of the first and second capping layers 142a and 142b may be selected from SiN, $SiO_2$, SiON, SiBN, SiCN, SIOCN, $Al_2O_3$, AlN, and AlON.

Figure 8:
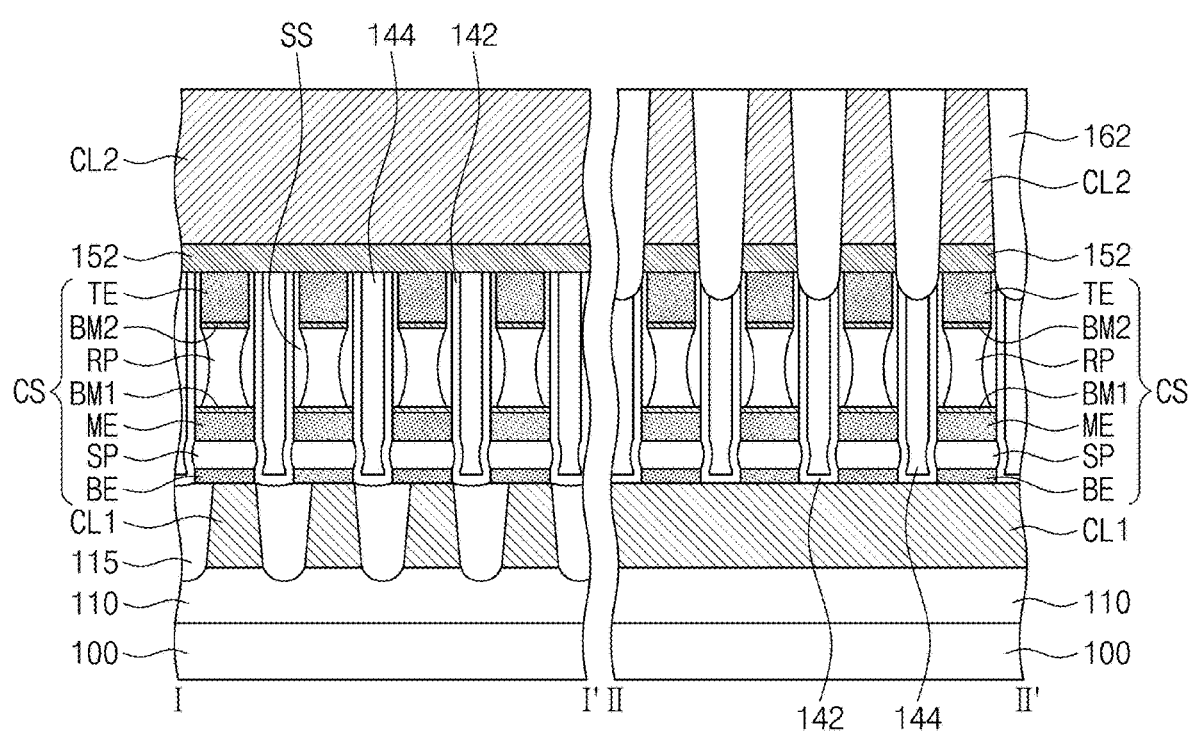

Referring to FIG. 8, centers of the cell stacks CS may be dislocated from centers of the first conductive lines CL1. The first electrode BE of the cell stack CS may be in contact with a portion of the lower insulating pattern 115, and a portion of the first capping pattern 142 may be in contact with the first conductive line CL1.

Figure 9:
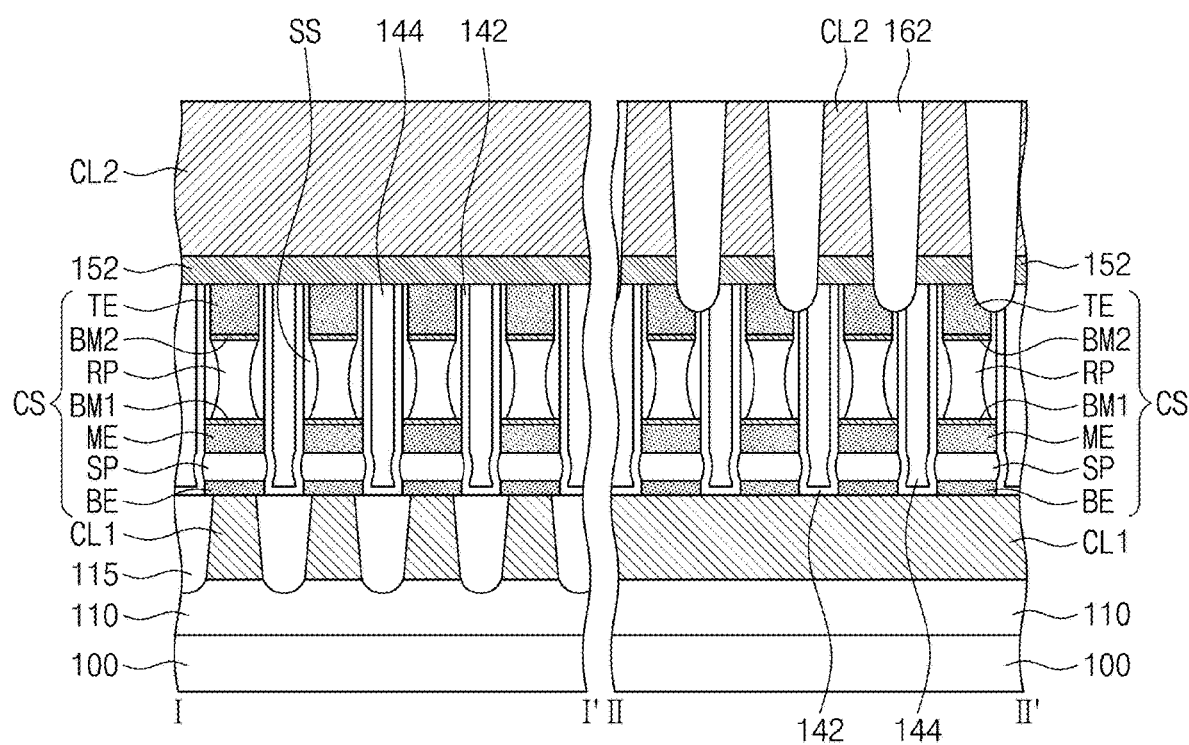

Referring to FIG. 9, the centers of the cell stacks CS may be dislocated from centers of the second conductive lines CL2. A portion of the barrier metal pattern 152 may be in contact with a portion of the first capping pattern 142 and a portion of the first gapfill insulating pattern 144, and a portion of the second gapfill insulating pattern 162 may be in contact with a portion of the third electrode TE of the cell stack CS.

Figure 10:
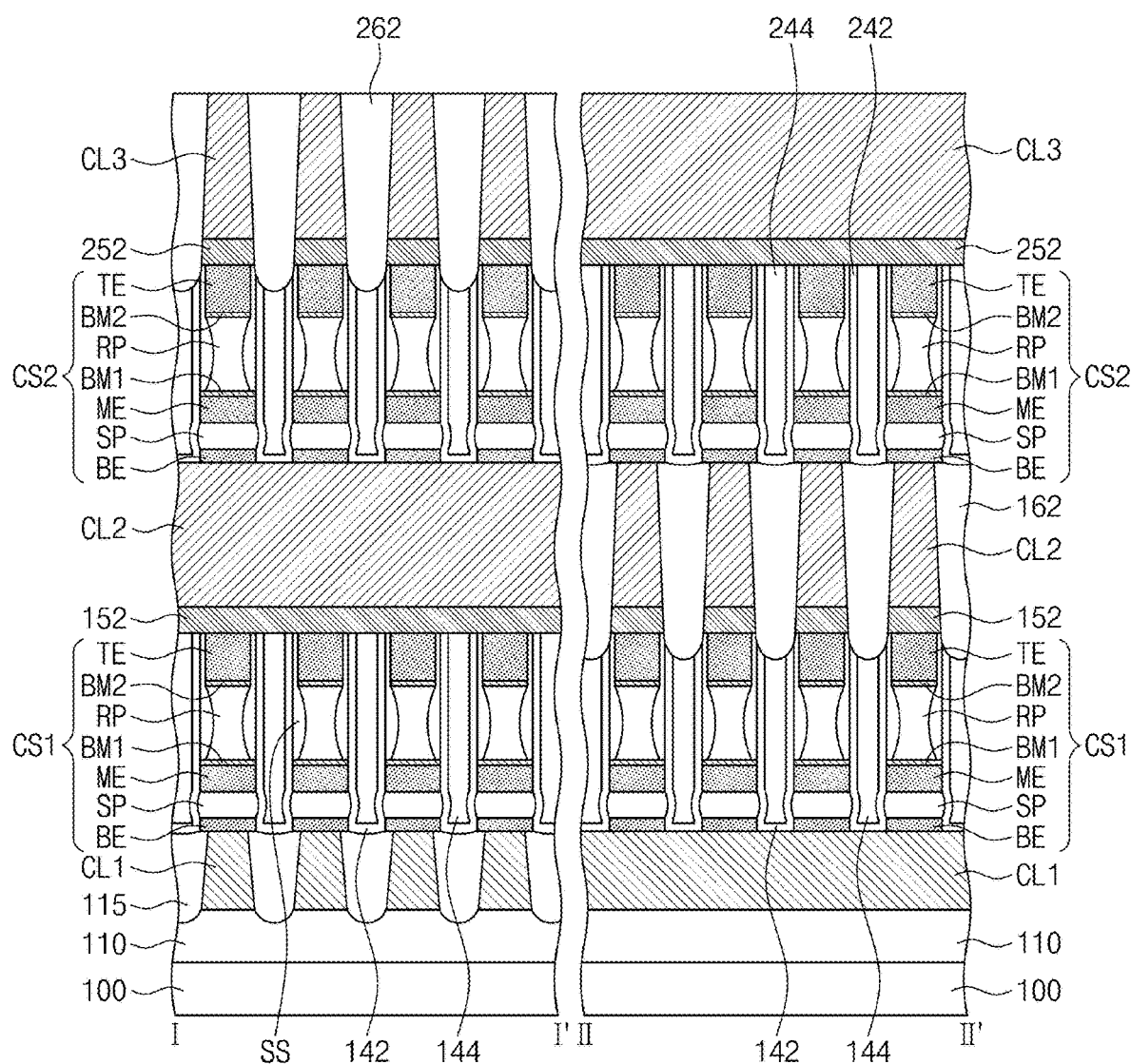

Referring to FIG. 10, a three-dimensional semiconductor memory device may include first and second cell stacks CS1 and CS2, which are vertically stacked on the substrate 100. The first cell stacks CS1 may be disposed at intersections of the first and second conductive lines CL1 and CL2, and the second cell stacks CS2 may be disposed at intersections of the second and third conductive lines CL2 and CL3. Each of the first and second cell stacks CS1 and CS2 may be configured to have substantially the same features as the cell stacks described with reference to FIG. 5.

The second conductive lines CL2 may be spaced apart from the first conductive lines CL1 in a vertical direction perpendicular to the top surface of the substrate 100, and the third conductive lines CL3 may be spaced apart from the second conductive lines CL2 in the vertical direction.

The first and third conductive lines CL1 and CL3 may be extended in the first direction D1 and the first conductive lines CL1 or the third conductive lines CL3 may be spaced apart from each other in the second direction D2. The second conductive lines CL2 may be extended in the second direction D2 and may be spaced apart from each other in the first direction D1.

The first barrier metal pattern 152 may be disposed between the second conductive lines CL2 and the first cell stacks CS1. A second barrier metal pattern 252 may be disposed between the third conductive lines CL3 and the second cell stacks CS2. The first and second barrier metal patterns 152 and 252 may be configured to have substantially the same features as the afore-described barrier metal pattern.

The first gapfill insulating pattern 144 may be disposed between the first cell stacks CS1, and the second gapfill insulating pattern 162 may be disposed between the second conductive lines CL2. A third gapfill insulating pattern 244 may be disposed between the second cell stacks CS2, and a fourth gapfill insulating pattern 262 may be disposed between the third conductive lines CL3.

The bottom surface of the second gapfill insulating pattern 162 may be located at a level between the top and bottom surfaces of the third electrode TE of the first cell stack CS1. A bottom surface of the fourth gapfill insulating pattern 262 may be located at a level between the top and bottom surfaces of the third electrode TE of the second cell stack CS2.

The first capping pattern 142 may be disposed between a side surface of the first cell stack CS1 and the first gapfill insulating pattern 144, and a second capping pattern 242 may be disposed between a side surface of the second cell stack CS2 and the third gapfill insulating pattern 244. The second capping pattern 242 may be in contact with a top surface of the second gapfill insulating pattern 162, and the third gapfill insulating pattern 244 may have a rounded top surface.

Figure 11:
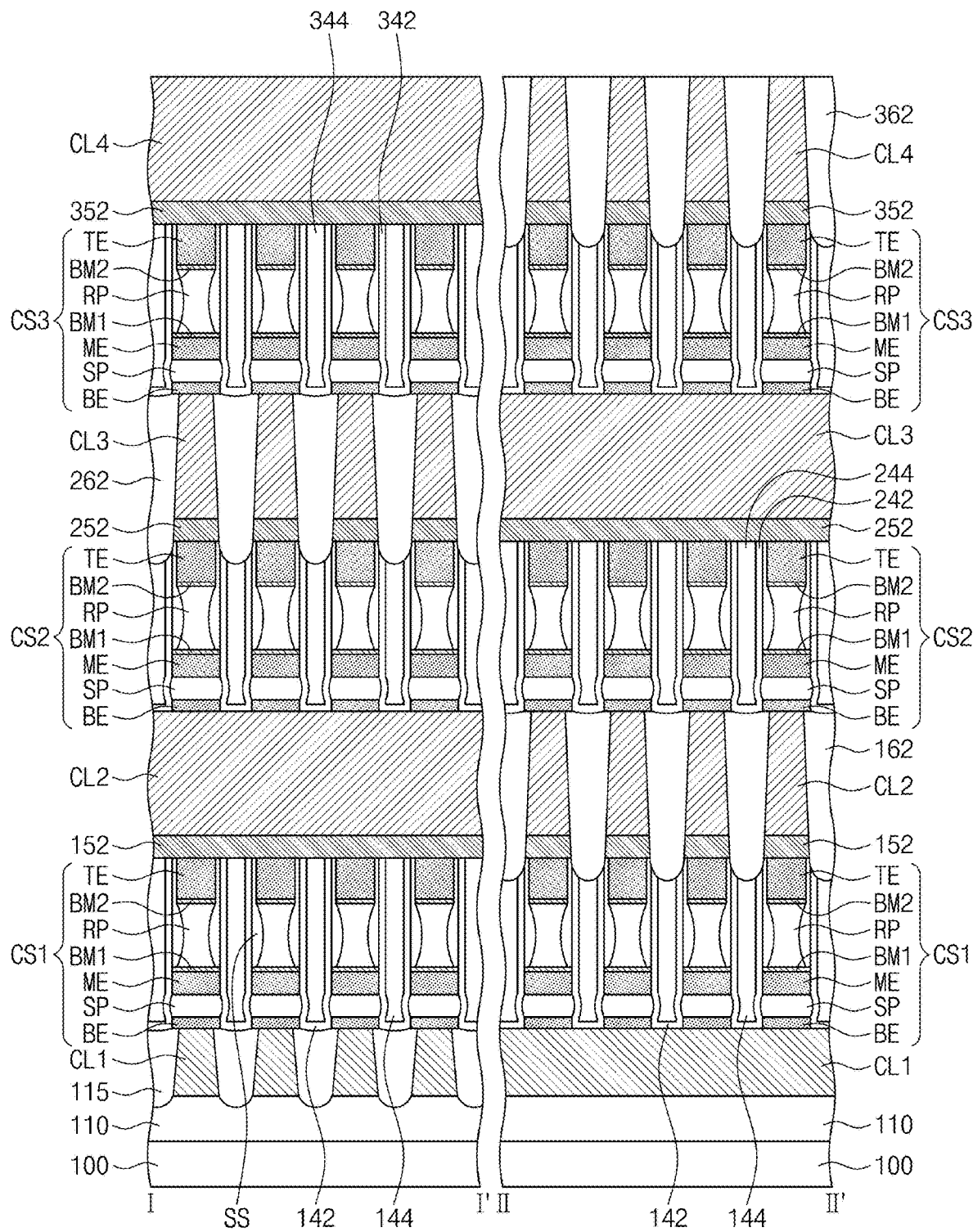

Referring to FIG. 11, a three-dimensional semiconductor memory device may include first, second, and third cell stacks CS1, CS2, and CS3, which are vertically stacked on the substrate 100.

The first cell stacks CS1 may be disposed at intersections of the first and second conductive lines CL1 and CL2, and the second cell stacks CS2 may be disposed at intersections of the second and third conductive lines CL2 and CL3. The third cell stacks CS3 may be disposed at intersections of the third and fourth conductive lines CL3 and CL4. Each of the first, second, and third cell stacks CS1, CS2, and CS3 may be configured to have substantially the same features as the cell stacks described with reference to FIG. 5.

In the description of FIG. 11, an element described with reference to FIG. 10 may be identified by the same reference number without repeating an overlapping description thereof, for the sake of brevity.

The third cell stacks CS3 may be disposed on the third conductive lines CL3, and the fourth conductive lines CL4 may be disposed on the third cell stacks CS3 to extend in the second direction D2 and may be spaced apart from each other in the first direction D1. A third barrier metal pattern 352 may be disposed between the fourth conductive lines CL4 and the third cell stacks CS3.

A fifth gapfill insulating pattern 344 may be disposed between the third cell stacks CS3, and a sixth gapfill insulating pattern 362 may be disposed between the fourth conductive lines CL4. A third capping pattern 342 may be disposed between a side surface of the third cell stack CS3 and the fifth gapfill insulating pattern 344. A bottom surface of the sixth gapfill insulating pattern 362 may be located between the top and bottom surfaces of the third electrode TE of the third cell stack CS3.

Figure 12:
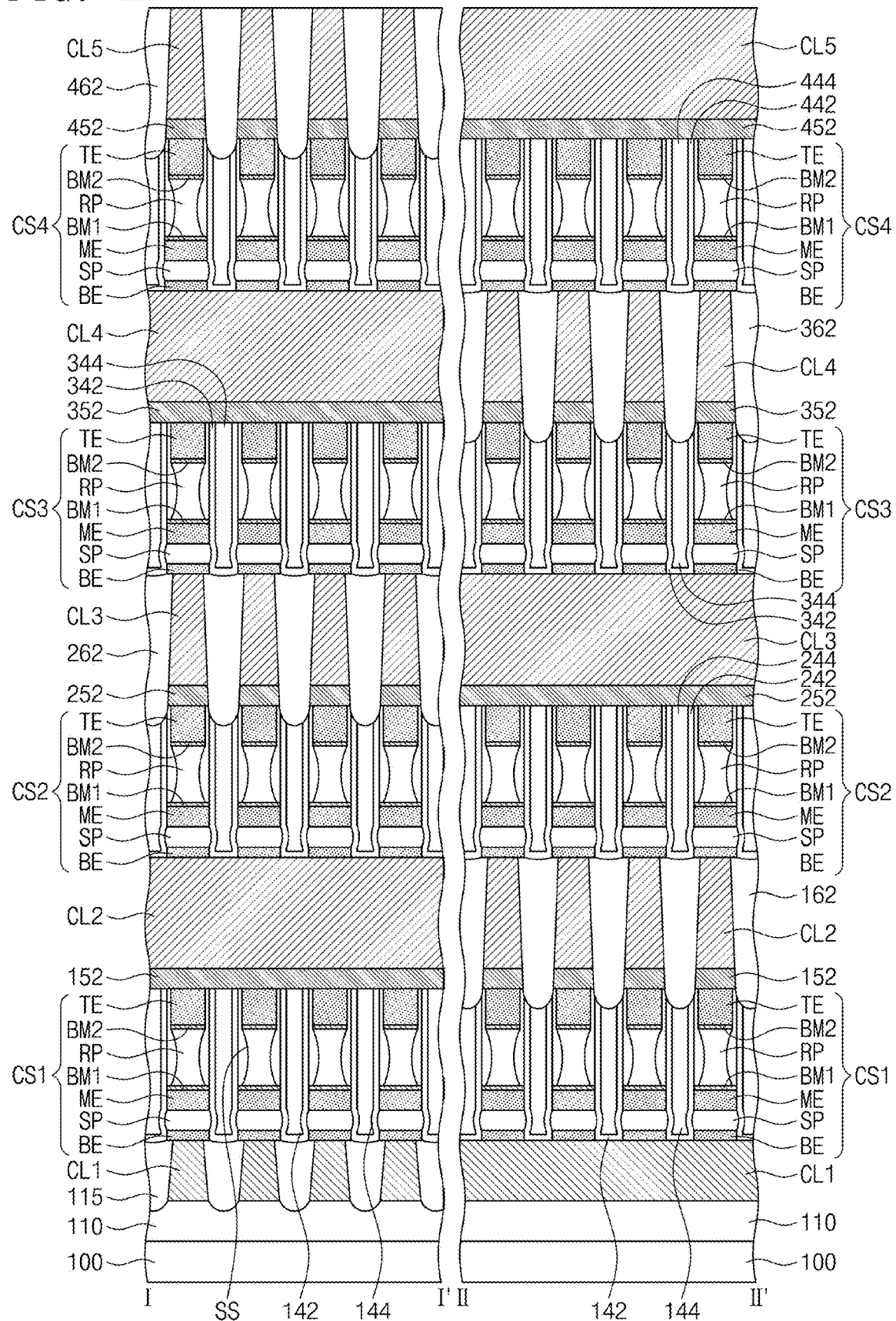

Referring to FIG. 12, a three-dimensional semiconductor memory device may include first, second, third, and fourth cell stacks CS1, CS2, CS3, and CS4, which are vertically stacked on the substrate 100.

The first cell stacks CS1 may be disposed at intersections of the first and second conductive lines CL1 and CL2, and the second cell stacks CS2 may be disposed at intersections of the second and third conductive lines CL2 and CL3. The third cell stacks CS3 may be disposed at intersections of the third and fourth conductive lines CL3 and CL4. The fourth cell stacks CS4 may be disposed at intersections of the fourth and fifth conductive lines CL4 and CL5. Each of the first, second, third, and fourth cell stacks CS1, CS2, CS3, and CS4 may be configured to have substantially the same features as the cell stacks described with reference to FIG. 5.

In the description of FIG. 12, an element described with reference to FIG. 11 may be identified by the same reference number without repeating an overlapping description thereof, for the sake of brevity.

The fourth cell stacks CS4 may be disposed on the fourth conductive lines CL4, and the fifth conductive lines CL5 may be disposed on the fourth cell stacks CS4 to extend in the first direction D1 and may be spaced apart from each other in the second direction D2. A fourth barrier metal pattern 452 may be disposed between the fifth conductive lines CL5 and the fourth cell stacks CS4.

A seventh gapfill insulating pattern 444 may be disposed between the fourth cell stacks CS4, and an eighth gapfill insulating pattern 462 may be disposed between the fifth conductive lines CL5. A fourth capping pattern 442 may be disposed between a side surface of the fourth cell stack CS4 and the seventh gapfill insulating pattern 444. A bottom surface of the eighth gapfill insulating pattern 462 may be located between the top and bottom surfaces of the third electrode TE of the fourth cell stack CS4.

Figure 13:
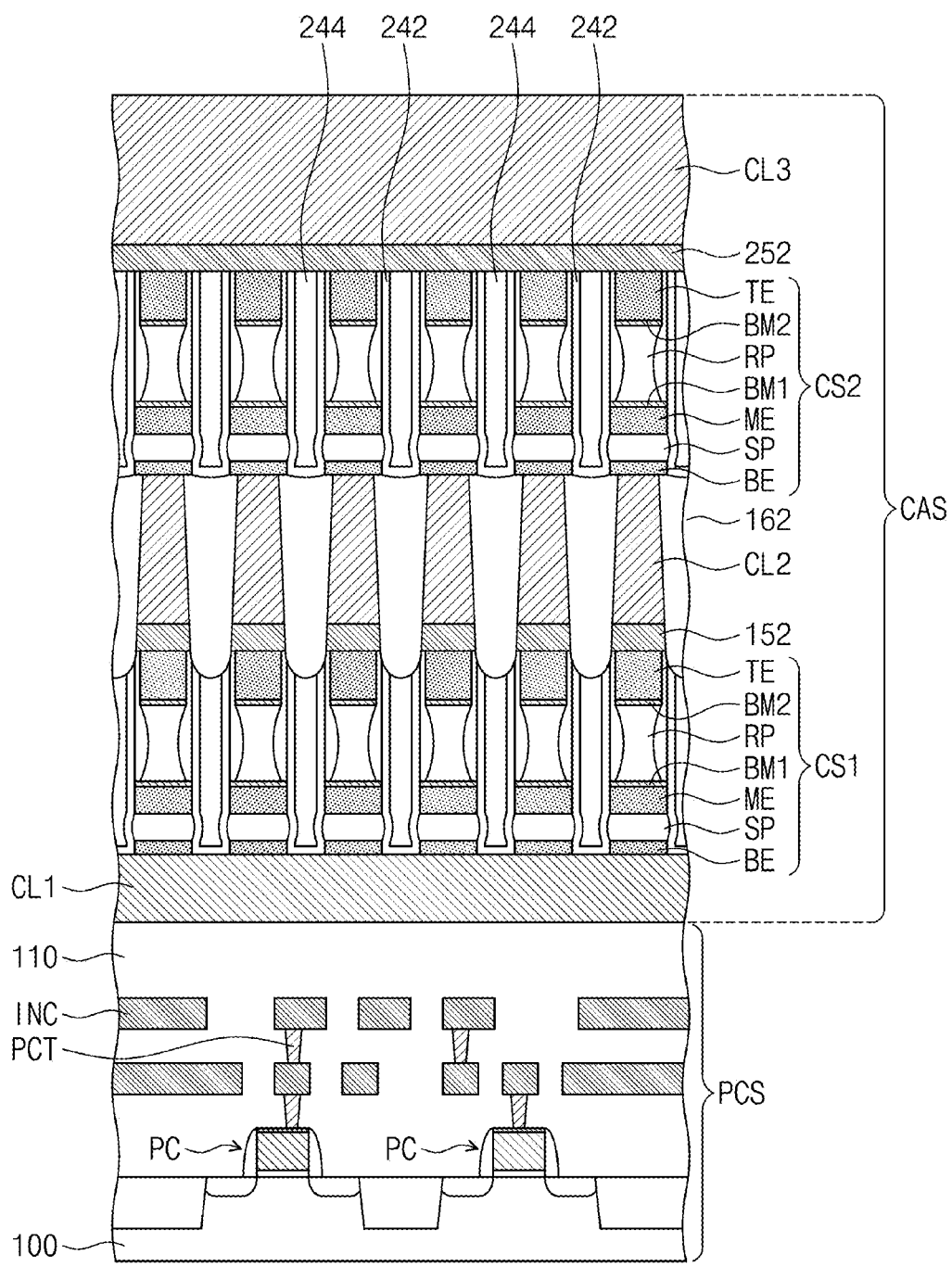
FIG. 13 is a sectional view illustrating a three-dimensional semiconductor memory device according to an embodiment of inventive concepts.

FIG. 13 is a sectional view illustrating a three-dimensional semiconductor memory device according to an embodiment of inventive concepts. In the following description, an element described above may be identified by the same reference number without repeating an overlapping description thereof, for the sake of brevity.

Referring to FIG. 13, a three-dimensional semiconductor memory device according to an embodiment of inventive concepts may include a peripheral circuit structure PCS and a cell array structure CAS on the peripheral circuit structure PCS.

In detail the peripheral circuit structure PCS may include peripheral logic circuits PC, which are integrated on the top surface of the substrate 100, and the interlayer insulating layer 110, which is provided to cover the peripheral logic circuits PC.

The substrate 100 may be a silicon substrate, a silicon-germanium substrate, a germanium substrate, or a single-crystalline epitaxial layer grown on a single-crystalline silicon substrate. The substrate 100 may include active regions defined by a device isolation layer.

The peripheral logic circuits PC may include row and column decoders, a page buffer, a control circuit, and so forth. In more detail, the peripheral logic circuits PC may include a gate insulating layer on the substrate 100, a gate electrode on the gate insulating layer, and source/drain regions at both sides of the gate electrode.

Peripheral interconnection lines INC may be electrically connected to the peripheral logic circuits PC via peripheral contact plugs PCT. For example, the peripheral contact plugs PCT and the peripheral interconnection lines INC may be coupled to NMOS and PMOS transistors.

The interlayer insulating layer 110 may be provided on the top surface of the substrate 100. The interlayer insulating layer 110 may cover the peripheral logic circuits PC, the peripheral contact plugs PCT, and the peripheral interconnection lines INC, on the substrate 100. The interlayer insulating layer 110 may include a plurality of stacked insulating layers. For example, the interlayer insulating layer 110 may include at least two of a silicon oxide layer, a silicon nitride layer, a silicon oxynitride layer, and/or a low-k dielectric layer.

The cell array structure CAS may be disposed on the interlayer insulating layer 110 and may include a plurality of vertically-stacked cell array layers, as described above. In other words, the cell array structure CAS may include conductive lines, which are provided to cross each other, and cell stacks, which are provided at respective intersections thereof, as described with reference to FIGS. 4 to 12.

FIGS. 14 to 22 are sectional views illustrating a method of fabricating a three-dimensional semiconductor memory device, according to an embodiment of inventive concepts, taken along the lines I-I' and II-II' of FIG. 4.

Figure 14:
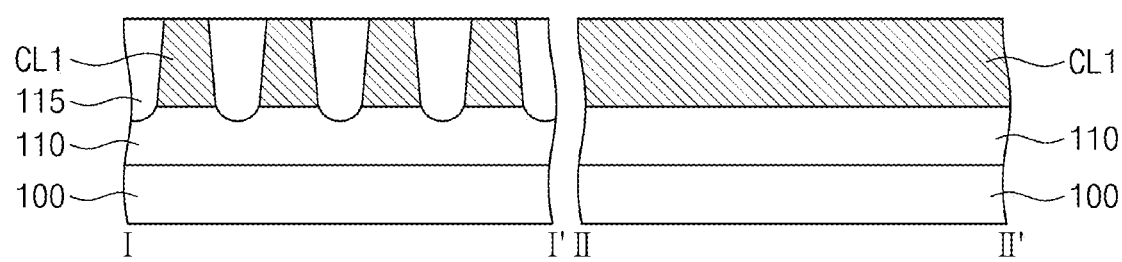
FIGS. 14 to 22 are sectional views illustrating a method of fabricating a three-dimensional semiconductor memory device, according to an embodiment of inventive concepts, taken along the lines I-I' and II-II' of FIG. 4.

Referring to FIGS. 4 and 14, the first conductive lines CL1, which are extended in the first direction D1 and are spaced apart from each other in the second direction D2, may be formed on the substrate 100.

The formation of the first conductive lines CL1 may include depositing a first conductive layer on the substrate 100, forming mask patterns (not shown) extending in the first direction D1, on the first conductive layer, and etching the first conductive layer using the mask patterns as an etch mask. The first conductive lines CL1 may be formed to have a lower width, which is larger than its upper width, and may have an inclined side surface.

The first conductive lines CL1 may include at least one of, for example, doped semiconductor materials (e.g., doped silicon), metallic materials (e.g., tungsten, aluminum, titanium, and/or tantalum), conductive metal nitrides (e.g., titanium nitride, tantalum nitride, and/or tungsten nitride), or metal-semiconductor compounds (e.g., metal silicide).

In an embodiment, the interlayer insulating layer 110 may be formed on the substrate 100, before the formation of the first conductive lines CL1, and in this case, a top surface of the interlayer insulating layer 110 between the first conductive lines CL1 may be recessed during a patterning process to form the first conductive lines CL1. The interlayer insulating layer 110 may be formed of or include an oxide material (e.g., silicon oxide) or a nitride material (e.g., silicon nitride).

The lower insulating patterns 115 may be formed to fill empty regions between the first conductive lines CL1, after the formation of the first conductive lines CL1. The lower insulating patterns 115 may be extended parallel to the first conductive lines CL1 or in the first direction D1. The formation of the lower insulating patterns 115 may include depositing a lower insulating layer to fill the empty regions between the first conductive lines CL1 and planarizing the lower insulating layer to expose the top surfaces of the first conductive lines CL1. The lower insulating patterns 115 may be formed of or include at least one of for example, silicon oxide, silicon nitride, and/or silicon oxynitride.

Figure 15:
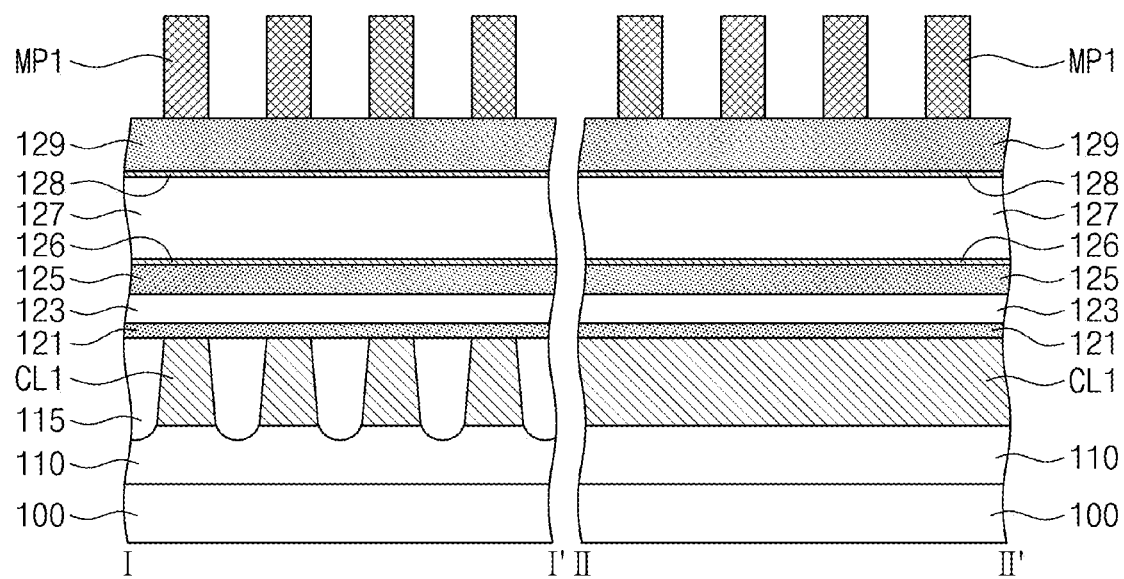

Referring to FIGS. 4 and 15, a first electrode layer 121, a switching layer 123, a second electrode layer 125, a variable resistor layer 127, and a third electrode layer 129 may be sequentially formed on the first conductive lines CL1 and the lower insulating patterns 115. In an embodiment, a first metal layer 126 may be additionally formed between the second electrode layer 125 and the variable resistor layer 127, and a second metal layer 128 may be additionally formed between the third electrode layer 129 and the variable resistor layer 127.

The third electrode layer 129 may be formed to be thicker than the first and second electrode layers 121 and 125. Alternatively, the first, second, and third electrode layers 121, 125, and 129 may be formed to have substantially the same thickness.

The first, second, and third electrode layers 121, 125, and 129 may be formed by a chemical vapor deposition (CVD) method, an organic metal chemical vapor deposition (MOCVD) method, or a plasma enhanced chemical vapor deposition (PECVD) method.

First mask patterns MP1 may be formed on the third electrode layer 129. The first mask patterns MP1 may be spaced apart from each other in the first and second directions D1 and D2, on the third electrode layer 129. The first mask patterns MP1 may be formed of or include at least one of silicon nitride, silicon carbide, silicon oxynitride, and/or poly-silicon.

Figure 16:
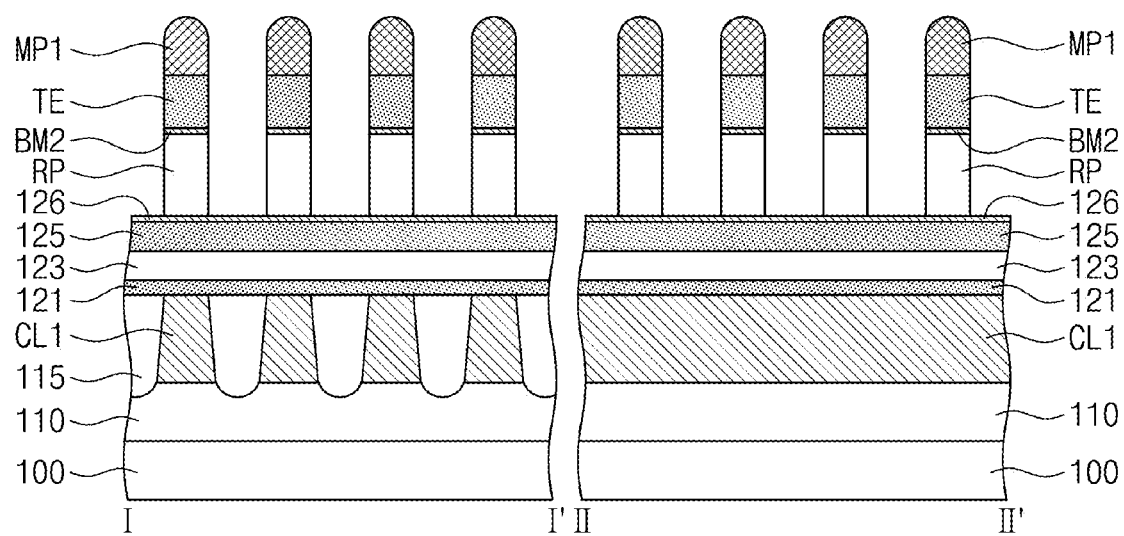

Referring to FIGS. 4 and 16, the third electrode layer 129, the second metal layer 128, and the variable resistor layer 127 may be sequentially etched using the first mask patterns MP1 as an etch mask. Accordingly, the variable resistance pattern RP, the second metal pattern BM2, and the third electrode TE may be formed on the first metal layer 126.

During the formation of the variable resistance pattern RP, the second metal pattern BM2, and the third electrode TE, the first mask patterns MP1 may be thinned and the first metal layer 126 may be used as an etch stop layer.

The variable resistance pattern RP, the second metal pattern BM2, and the third electrode TE may be patterned using a highly anisotropic etching process. As an example, the etching process to form the variable resistance pattern RP, the second metal pattern BM2, and the third electrode TE may include an ion beam etching process and/or a reactive ion etching process.

In an embodiment, the variable resistance pattern RP may have an inclined side surface or a rounded side surface, after the anisotropic etching process. As an example, by adjusting a process condition (e.g., etching gas, polymer amount, temperature, and pressure, and so forth) for the etching process to form the variable resistance pattern RP, it may be possible to recess the side surface of the variable resistance pattern RP. In this case, the side surface of the variable resistance pattern RP may be laterally recessed, compared with the side surface of the third electrode TE, as shown in FIG. 6A, and the variable resistance pattern RP may have the minimum width at its intermediate level (e.g., its top and bottom levels).

Figure 17:
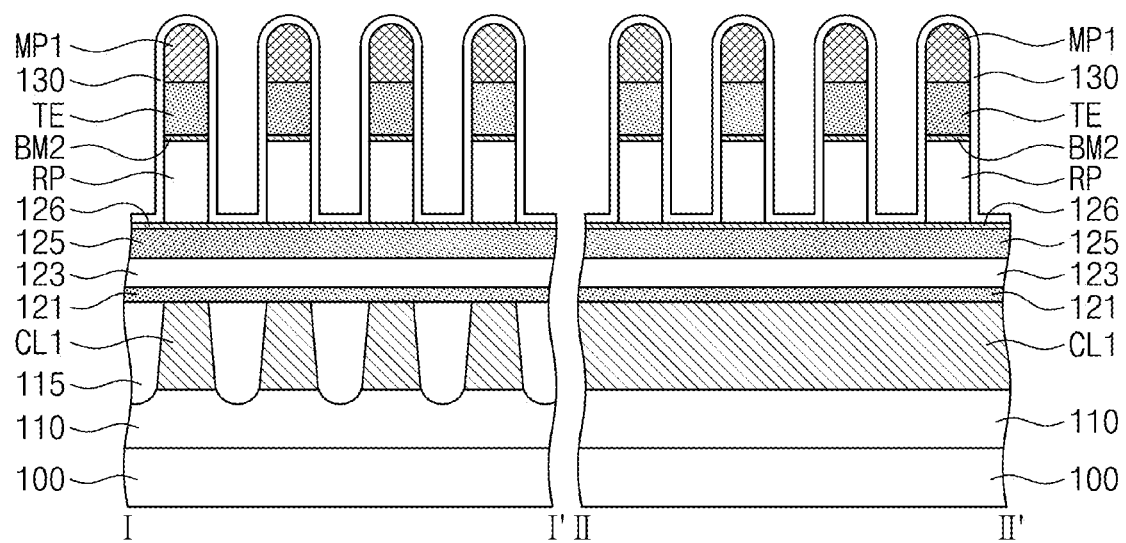

Referring to FIG. 17, a spacer layer 130 may be formed to cover the side surface of the variable resistance pattern RP. In detail, the spacer layer 130 may be formed to conformally cover the structure of FIG. 16 provided on the first metal layer 126. The spacer layer 130 may be a single layer or a multiple layer. The spacer layer 130 may be formed of or include silicon oxide and may be formed by an atomic layer deposition method and/or a chemical vapor deposition method.

Figure 18:
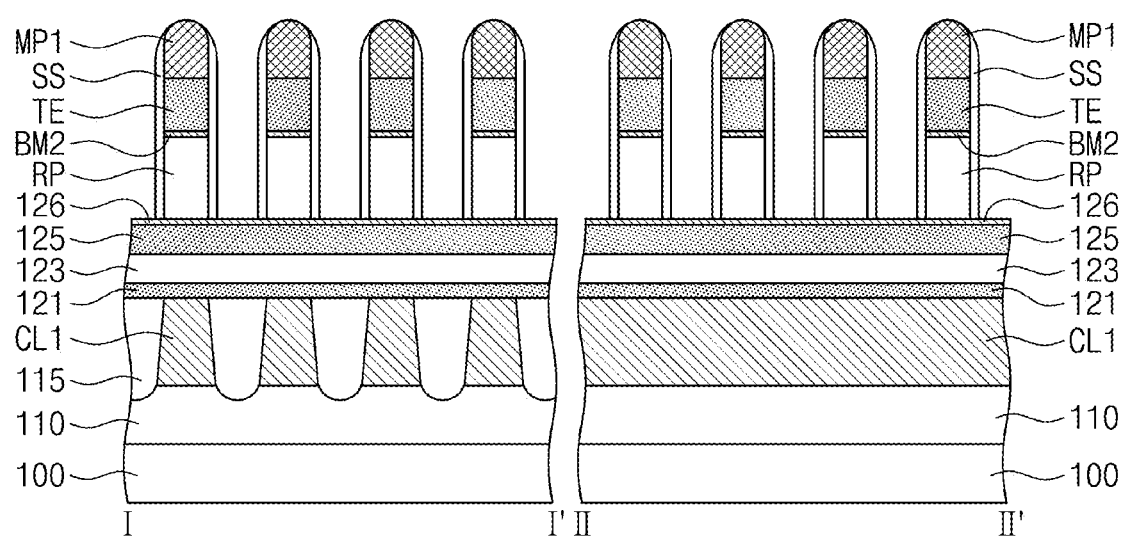

Referring to FIG. 18, a blanket anisotropic etching process may be performed on the spacer layer 130 to form the sidewall spacers SS on the side surfaces of the variable resistance patterns RP. The etching process may include an ion beam etching process and/or a reactive ion etching process.

During the formation of the sidewall spacers SS, the first metal layer 126 may be etched to form the first metal pattern BM1. The sidewall spacers SS may be formed to expose top surfaces of the first mask patterns MP1.

Although the sidewall spacer SS is illustrated to be a single layer, but inventive concepts are not limited to this example. The sidewall spacer SS may be a multi-layered structure including a plurality of layers.

Figure 19:
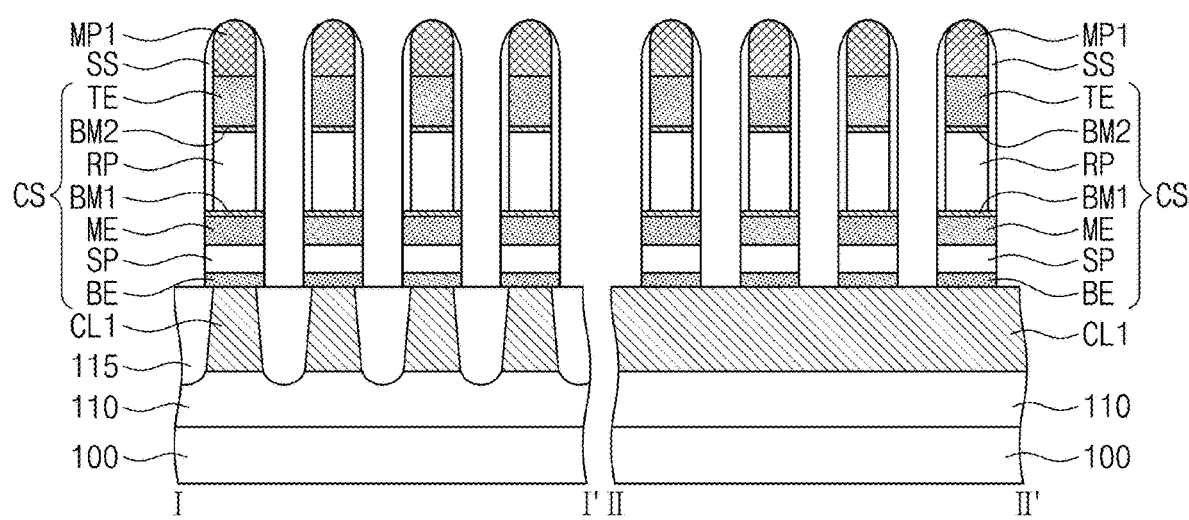

Referring to FIG. 19, the first metal layer 126, the second electrode layer 125, the switching layer 123, and the first electrode layer 121 may be sequentially etched using the first mask patterns MP1 and the sidewall spacers SS as an etch mask. Accordingly, the first electrode BE, the switching pattern SP, and the second electrode ME may be formed. That is, the cell stacks CS, which are spaced apart from each other, may be formed on each of the first conductive lines CL1.

The formation of the first electrode BE, the switching pattern SP, and the second electrode ME may be performed using a highly anisotropic etching process. As an example, this etching process may include an ion beam etching process and/or a reactive ion etching process.

Portions of the lower insulating patterns 115 and portions of the first conductive lines CL1 may be exposed to the outside, after the formation of the first electrode BE, the switching pattern SP, and the second electrode ME.

A width of the switching pattern SP may be larger than a width of the variable resistance pattern RP. The switching pattern SP may have an upper width, which is smaller than its lower width, and may have an inclined side surface.

After the formation of the switching pattern SP, the side surface of the switching pattern SP may have a laterally protruding shape, compared with the side surfaces of the first and second electrodes BE and ME, and may have the maximum width at a level between its top and bottom levels, as shown in FIG. 6A.

Figure 20:
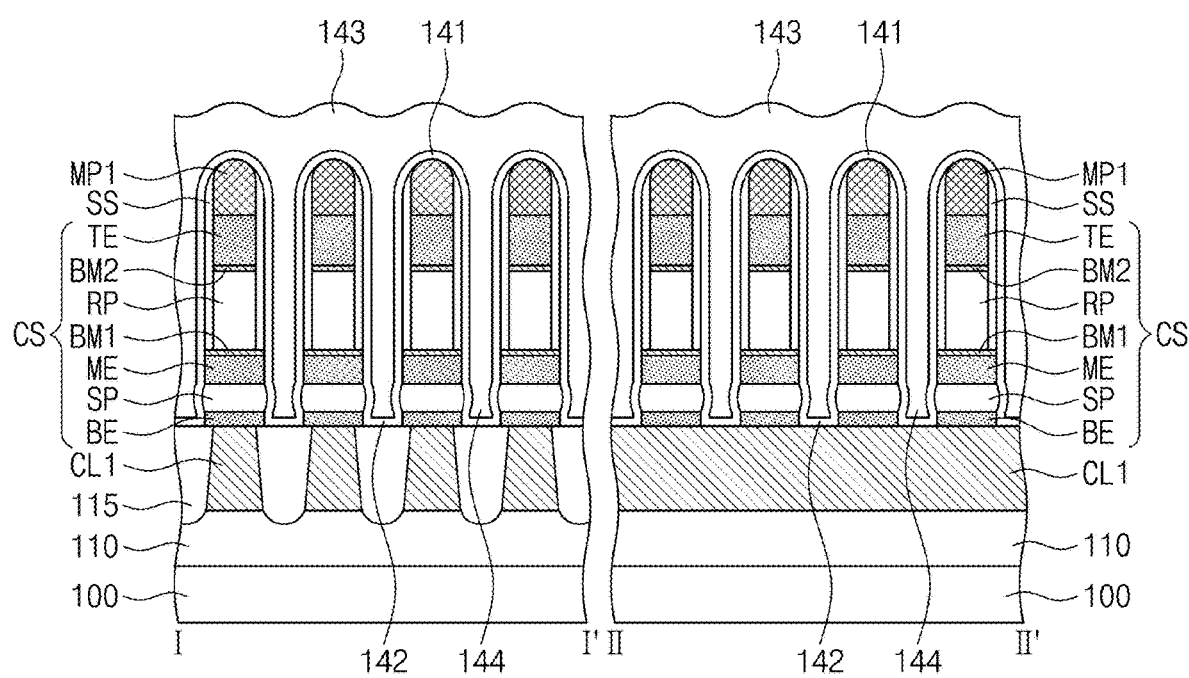

Referring to FIG. 20, a capping layer 141 may be formed to cover the cell stacks CS. The capping layer 141 may cover not only the side surfaces of the cell stacks CS and but also the top surfaces of the lower insulating patterns 115 exposed between the cell stacks CS. The capping layer 141 may be formed of or include at least one of, for example, SiN, $SiO_2$, SiON, SiBN, SiCN, SIOCN, $Al_2O_3$, AlN, or AlON.

The capping layer 141 may be formed by an atomic layer deposition, a chemical vapor deposition, and/or a physical vapor deposition. The capping layer 141 may be formed to have a thickness that is smaller than half of a distance between adjacent ones of the cell stacks CS. In this case, an empty space, which is not filled with the capping layer 141, may be formed between the cell stacks CS, after the deposition of the capping layer 141.

A post-treatment process may be performed to improve the quality of the formed layer(s), after the deposition of the capping layer 141. As an example, the post-treatment process may be performed using a thermal treatment process, a UV treatment process, or a plasma treatment process. At least one of inactive or inert gases, such as N, He, and Ar, may be used during the post-treatment process.

Thereafter, an insulating gapfill layer 143 may be formed to fill empty regions between the cell stacks CS. The insulating gapfill layer 143 may be formed of or include an insulating material different from the capping layer 141.

The insulating gapfill layer 143 may be formed on the capping layer 141 to completely fill the remaining spaces between the cell stacks CS. The insulating gapfill layer 143 may be formed by a deposition method (e.g., a flowable chemical vapor deposition (FCVD) method or a spin-onglass (SOG) coating method) having a good gap-filling property. Alternatively, the insulating gapfill layer 143 may be formed by an atomic layer deposition, a chemical vapor deposition, and/or a physical vapor deposition.

The insulating gapfill layer 143 may be formed of or include at least one of low-k dielectric materials. The insulating gapfill layer 143 may be formed of or include at least one of, for example, SiN, SiON, SiC, SiCN, SiOC, SiOCN, $SiO_2$, or $Al_2O_3$.

Figure 21:
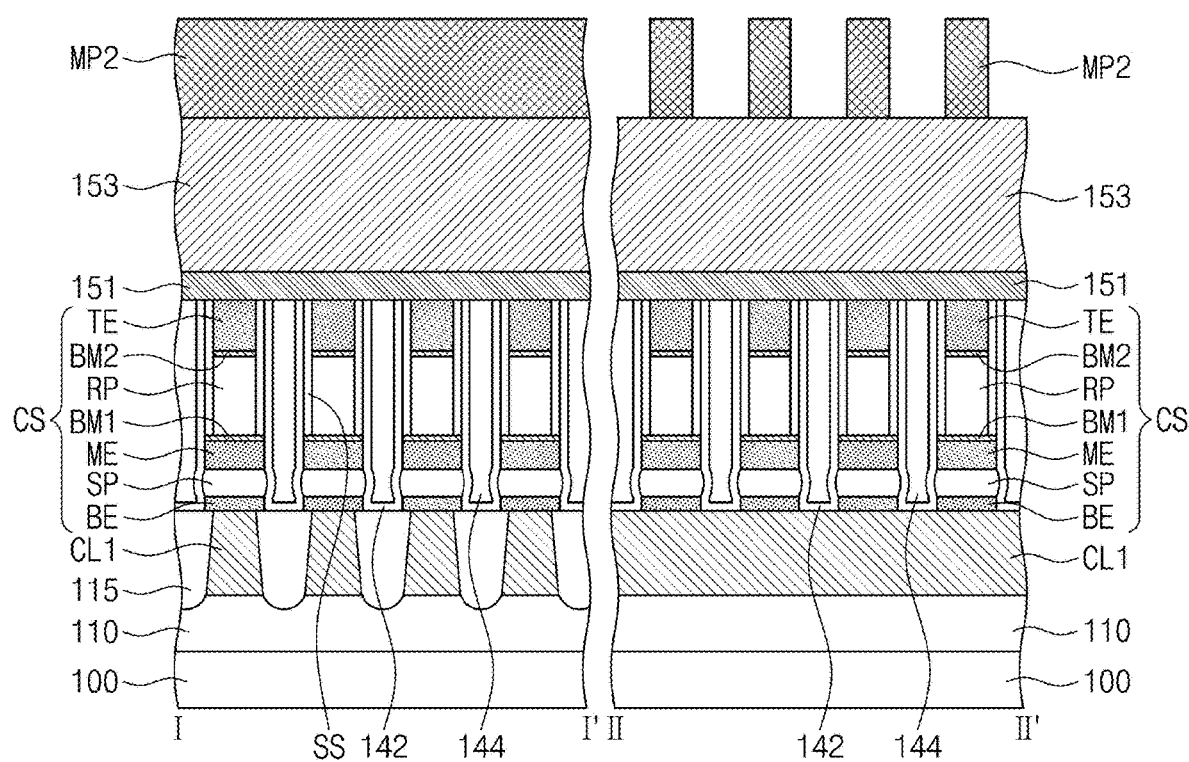

Referring to FIGS. 4 and 21, a planarization process may be performed on the insulating gapfill layer 143 and the capping layer 141 to expose the third electrodes TE of the cell stacks CS. Accordingly, the capping pattern 142 and the first gapfill insulating pattern 144 may be formed between the cell stacks CS. A chemical mechanical polishing (CMP) process may be performed as the planarization process. During the planarization process, the first mask patterns MP1 may be removed. In an embodiment, during the planarization process, top surfaces of the capping pattern 142 and the first gapfill insulating pattern 144 may be recessed, compared with the top surfaces of the cell stacks CS.

Thereafter, a barrier metal layer 151 and a metal layer 153 may be sequentially stacked on the cell stacks CS. The barrier metal layer 151 may be formed to cover the top surfaces of the cell stacks CS and the top surface of the first gapfill insulating pattern 144. Each of the barrier metal layer 151 and the metal layer 153 may be formed by an atomic layer deposition method and/or a chemical vapor deposition method.

The barrier metal layer 151 may be formed at least one of materials having an etch selectivity with respect to the third electrodes TE of the cell stacks CS. The barrier metal layer 151 may be formed of or include at least one of conductive materials (e.g., metallic materials). The barrier metal layer 151 may be formed of or include at least one of, for example, Ti, Ta, TiN, TaN, or AlN. The barrier metal layer 151 may be deposited to have a thickness ranging from about 30 Å to about 150 Å.

The metal layer 153 may be formed of or include the same conductive material as the first conductive lines CL1. The metal layer 153 may be deposited to have a thickness that is about two times larger than a thickness of the first conductive lines CL1. The metal layer 153 may be formed of or include at least one of, for example, copper, tungsten, aluminum, ruthenium, and/or platinum.

Thereafter, second mask patterns MP2 may be formed on the metal layer 153. The second mask patterns MP2 may be line-shaped patterns extending in the second direction D2 on the metal layer 153. The second mask patterns MP2 may be formed of or include at least one of silicon nitride, silicon carbide, and/or silicon oxynitride.

Figure 22:
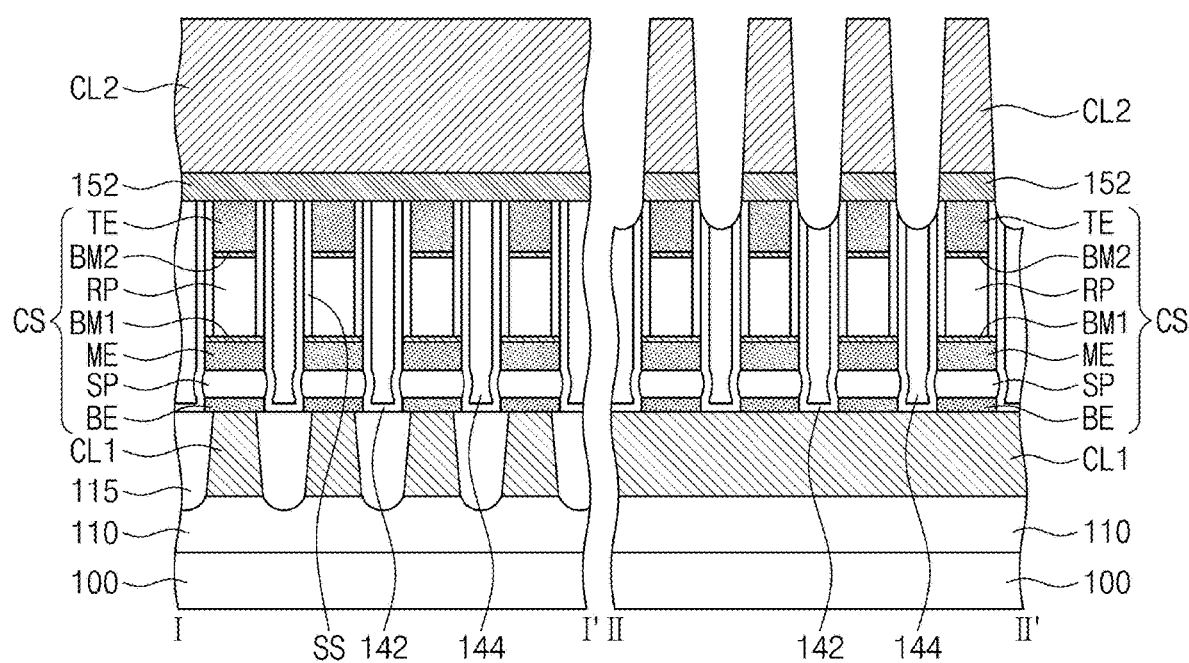

Referring to FIGS. 4 and 22, an anisotropic etching process using the second mask pattern MP2 as an etch mask may be performed on the metal layer 153 and the barrier metal layer 151. Accordingly, the second conductive lines CL2 and the barrier metal pattern 152 may be formed on the cell stacks CS to extend in the second direction D2. The second conductive lines CL2 and the barrier metal pattern 152 may be formed to partly expose the first gapfill insulating pattern 144.

Each of the second conductive lines CL2 may have a top width, which is smaller than its bottom width, and may have an inclined side surface. Similarly, the barrier metal pattern 152 may have a top width, which is smaller than its bottom width, and may have an inclined side surface.

Since the metal layer 153 and the barrier metal layer 151 are formed of different materials, a stepwise or recessed structure may be formed near a boundary between the barrier metal pattern 152 and the second conductive lines CL2, as shown in FIG. 6B, after the formation of the second conductive lines CL2 and the barrier metal pattern 152.

In an embodiment, the etching process to form the barrier metal pattern 152 may be performed in an over-etching manner, and in this case, the top surface of the first gapfill insulating pattern 144 and/or the top surface of the first capping pattern 142 may be recessed. As a result, each of the first gapfill insulating pattern 144 and the first capping pattern 142 may have a rounded top surface, after the formation of the second conductive lines CL2 and the barrier metal pattern 152. In an embodiment, a portion of the first capping pattern 142 may be exposed during the formation of the barrier metal pattern 152. In another embodiment, a portion of the third electrodes TE of the cell stacks CS may be exposed during the formation of the barrier metal pattern 152.

Next, referring to FIGS. 4 and 5, the second gapfill insulating patterns 162 may be formed to fill empty regions between the second conductive lines CL2 and between the barrier metal patterns 152.

The second gapfill insulating patterns 162 may be formed of or include at least one of impurity-doped silicon oxide materials. For example, the impurity-doped silicon oxide materials may be, for example, fluorine-doped oxide (e.g., FSG), carbon-doped oxide (e.g., SiOC), silicon oxide, hydrogen silsesquioxane (HSQ; SiO:H), methyl silsesquioxane (MSQ; SiO:CH3), a-SiOC (SiOC:H), or the like.

The formation of the second gapfill insulating patterns 162 may include forming a second insulating gapfill layer to cover the second conductive lines CL2 and the barrier metal patterns 152 and performing a planarization process on the second insulating gapfill layer to expose the top surfaces of the second conductive lines CL2.

The second insulating gapfill layer may be formed by a deposition method having a good gap-filling property (for example, by a flowable chemical vapor deposition (FCVD) method or a spin-on-glass (SOG) coating method).

Alternatively, a second capping layer (not shown) may be formed, before the forming of the second insulating gapfill layer. The second capping layer may be formed to conformally cover the side surfaces of the second conductive lines CL2 and the barrier metal patterns 152.

According to an embodiment of inventive concepts, in a process of forming a cell stack of a three-dimensional semiconductor memory device, a patterning process is performed, regardless of first and second conductive lines. Thus, it may be possible to prevent the cell stacks from falling by an increase in aspect ratio of the cell stack. In addition, the cell stack may be formed by performing an etching process one time, and thus, it may be possible to prevent or suppress a side surface of the cell stack from being damaged by the formation of the first or second conductive line.

In addition, a variable resistance pattern may be formed to have the minimum width at its intermediate level (e.g., between top and bottom levels). In this case, it may be possible to reduce a driving current or power, which is consumed during an operating of the three-dimensional semiconductor memory device. Accordingly, it may be possible to provide the three-dimensional semiconductor memory device with improved electric characteristics.

While example embodiments of inventive concepts have been particularly shown and described, it will be understood by one of ordinary skill in the art that variations in form and detail may be made therein without departing from the spirit and scope of inventive concepts in the attached claims.

What is claimed is:

1. A three-dimensional semiconductor memory device, comprising:
a first conductive line extending in a first direction;
a second conductive line extending in a second direction crossing the first direction;
a cell stack at an intersection of the first conductive line and the second conductive line,
the cell stack including a first electrode, a second electrode, and a third electrode, which are sequentially stacked, a switching pattern between the first electrode and the second electrode, and a variable resistance pattern between the second electrode and the third electrode; and
a gapfill insulating pattern covering a side surface of the cell stack, a top surface of the gapfill insulating pattern being located between a top surface of the third electrode and a bottom surface of the third electrode, and a bottom surface of the gapfill insulating pattern being located at substantially the same level as or a higher level than a top surface of the first conductive line.

2. The device of claim 1, wherein the switching pattern has a laterally convex side surface, compared with a side surface of the first electrode and a side surface of the second electrode.

3. The device of claim 1, wherein the switching pattern has a maximum width at a level between a top surface of the switching pattern and a bottom surface of the switching pattern.

4. The device of claim 3, further comprising:
a substrate;
a first capping pattern;
barrier metal patterns;
a sidewall spacer; and
a second gapfill insulating pattern, wherein
the first conductive line is one of a plurality of first conductive lines on the substrate and extending in the first direction,
the first direction is parallel to a top surface of the substrate,
the second conductive line is one of a plurality of second conductive lines on the substrate and extending in the second direction,
the cell stack is one of a plurality of cell stacks on the substrate,
the plurality of cell stacks are at respective intersections of the plurality of first conductive lines and the plurality of second conductive lines, and
each of plurality of cell stacks includes a same structure as the cell stack such that each of the plurality of cell stacks includes the first electrode, the second electrode, and the third electrode sequentially stacked, a switching pattern between the first electrode and the second electrode, the variable resistance pattern between the second electrode and the third electrode, and the switching pattern having the maximum width at the level between the top surface of the switching pattern and the bottom surface of the switching pattern,
the variable resistance pattern has a minimum width at a level between a top surface of the variable resistance pattern and a bottom surface of the variable resistance pattern;
the gapfill insulating pattern is a first gapfill insulating pattern filling a region between the plurality of cell stacks such that an uppermost surface of the first gapfill insulating pattern is located between the top surface of the third electrode and the bottom surface of the third electrode,
the first capping pattern is between side surfaces of the plurality of cell stacks and the first gapfill insulating pattern,
the variable resistance pattern in each of the plurality of cell stacks provides a plurality of variable resistance patterns,
the sidewall spacer is between the plurality of variable resistance patterns of the plurality of cell stacks and the first capping pattern
the barrier metal patterns are between the plurality of second conductive lines and the plurality of cell stacks,
the barrier metal patterns extending in the second direction,
the second gapfill insulating pattern is on the first gapfill insulating pattern, and
the second gapfill insulating pattern covers side surfaces of the plurality of second conductive lines and side surfaces of the barrier metal patterns.

5. The device of claim 1, wherein the variable resistance pattern has a minimum width at a level between a top surface of the variable resistance pattern and a bottom surface of the variable resistance pattern.

6. The device of claim 1, wherein the variable resistance pattern has a rounded side surface, and
wherein the gapfill insulating pattern covers the rounded side surface of the variable resistance pattern.

7. The device of claim 1, wherein the variable resistance pattern has a recessed side surface, compared with a side surface of the second electrode and a side surface of the third electrode.

8. A three-dimensional semiconductor memory device, comprising:
a first conductive line extending in a first direction;
a second conductive line extending in a second direction crossing the first direction;
a cell stack at an intersection of the first conductive line and the second conductive line,
the cell stack including a first electrode, a second electrode, and a third electrode, which are sequentially stacked, a switching pattern between the first electrode and the second electrode, and a variable resistance pattern between the second electrode and the third electrode;
a gapfill insulating pattern covering a side surface of the cell stack, a top surface of the gapfill insulating pattern being located between a top surface of the third electrode and a bottom surface of the third electrode; and
a barrier metal pattern between the second conductive line and the third electrode, wherein
the barrier metal pattern extends in the second direction, and
a lower width of the barrier metal pattern is larger than an upper width of the barrier metal pattern.

9. The device of claim 8, wherein the upper width of the barrier metal pattern is smaller than a lower width of the second conductive line.

10. The device of claim 8, wherein the lower width of the barrier metal pattern is larger than an upper width of the cell stack.

11. The device of claim 1, wherein the cell stack has a circular top surface.

12. The device of claim 1, wherein a lower width of the cell stack is larger than an upper width of the first conductive line in the second direction.

13. The device of claim 1, further comprising:
a sidewall spacer between the gapfill insulating pattern and a side surface of the variable resistance pattern.

14. The device of claim 13, wherein
the cell stack further comprises a first metal pattern and a second metal pattern,
the first metal pattern is between the second electrode and the variable resistance pattern,
the second metal pattern is between the third electrode and the variable resistance pattern,
the sidewall spacer is on the first metal pattern, and
the sidewall spacer covers the side surface of the variable resistance pattern.

15. The device of claim 1, further comprising:
a capping pattern between the gapfill insulating pattern and the cell stack,
wherein the capping pattern comprises a sidewall portion covering the side surface of the cell stack and a bottom portion covering a bottom surface of the gapfill insulating pattern.

16. A three-dimensional semiconductor memory device, comprising:
a substrate;
first conductive lines on the substrate and extending in a first direction parallel to a top surface of the substrate;
second conductive lines extending in a second direction crossing the first direction;
cell stacks at respective intersections of the first conductive lines and the second conductive lines, an upper width of the first conductive lines being smaller than a lower width of the cell stacks, a lower width of the second conductive lines being larger than an upper width of the cell stacks;
a first gapfill insulating pattern filling a region between the cell stacks; and
a second gapfill insulating pattern filling a region between the second conductive lines,
a bottom surface of the second gapfill insulating pattern being located at a level lower than top surfaces of the cell stacks.

17. The device of claim 16, further comprising:
separation insulating patterns between the second conductive lines, the separation insulating patterns covering sidewalls of the second conductive lines,
wherein the separation insulating patterns are in contact with the top surface of the gapfill insulating pattern.

18. The device of claim 16, wherein
each of the cell stacks comprises,
a first electrode, a second electrode, and a third electrode, which are sequentially stacked,
a switching pattern between the first electrode and the second electrode,
a variable resistance pattern between the second electrode and the third electrode,
a first metal pattern between the second electrode and the variable resistance pattern, and
a second metal pattern between the third electrode and the variable resistance pattern, and
a distance between adjacent one of the switching patterns is smaller than
a distance between adjacent one of the first electrodes.

19. The device of claim 16, further comprising:
a barrier metal pattern between the second conductive lines and the cell stacks, wherein
an upper width of the barrier metal pattern is smaller than a lower width of the second conductive line, and
a lower width of the barrier metal pattern is larger than the upper width of the barrier metal pattern.

20. The device of claim 16, further comprising:
a capping pattern including a sidewall portion and a bottom portion, wherein
the sidewall portion is provided between side surfaces of the cell stacks and a side surface of the first gapfill insulating pattern, and
the bottom portion covers a bottom surface of the first gapfill insulating pattern.

* * * * *